United States Patent
Howald

(10) Patent No.: US 7,583,492 B2
(45) Date of Patent: Sep. 1, 2009

(54) METHOD OF DETERMINING THE CORRECT AVERAGE BIAS COMPENSATION VOLTAGE DURING A PLASMA PROCESS

(75) Inventor: Arthur M. Howald, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/725,772

(22) Filed: Mar. 19, 2007

(65) Prior Publication Data

US 2007/0285869 A1 Dec. 13, 2007

Related U.S. Application Data

(63) Continuation-in-part of application No. 10/882,837, filed on Jun. 30, 2004, now Pat. No. 7,218,503, which is a continuation-in-part of application No. 10/126,832, filed on Apr. 18, 2002, now Pat. No. 6,965,506, which is a continuation-in-part of application No. 09/163,368, filed on Sep. 30, 1998, now Pat. No. 6,790,375.

(60) Provisional application No. 60/322,580, filed on Sep. 14, 2001.

(51) Int. Cl.
*H01T 23/00* (2006.01)
(52) U.S. Cl. ..................... 361/234; 361/230
(58) Field of Classification Search .......... 361/230–234
See application file for complete search history.

(56) References Cited

U.S. PATENT DOCUMENTS

| | | | | |
|---|---|---|---|---|
| 5,612,850 A * | 3/1997 | Birang et al. | ............... | 361/234 |
| 5,793,192 A * | 8/1998 | Kubly et al. | ................ | 323/312 |
| 6,175,485 B1 * | 1/2001 | Krishnaraj et al. | .......... | 361/234 |
| 6,228,278 B1 * | 5/2001 | Winniczek et al. | ............ | 216/61 |
| 6,361,645 B1 * | 3/2002 | Schoepp et al. | ............. | 361/234 |

* cited by examiner

*Primary Examiner*—Danny Nguyen
(74) *Attorney, Agent, or Firm*—Martine Penilla & Gencarella, LLP

(57) ABSTRACT

A method for removing a substrate that is attached to a bipolar electrostatic chuck (ESC) by application of a bipolar ESC voltage is provided which includes discontinuing the bipolar ESC voltage after processing a current substrate, and determining a monopolar component error of the processing. The method also includes correcting the monopolar component error for a subsequent substrate.

17 Claims, 17 Drawing Sheets

METHOD OF DETERMINING THE CORRECT AVERAGE BIAS COMPENSATION VOLTAGE DURING A PLASMA PROCESS

CLAIM OF PRIORITY

This patent application is a continuation-in-part of U.S. patent application Ser. No. 10/882,837, filed on Jun. 30, 2004 now U.S. Pat. No. 7,218,503, from which priority under 35 U.S.C. § 120 is claimed, entitled "Method of Determining the Correct Average Bias Compensation Voltage During A Plasma Process" which is a continuation-in-part of U.S. patent application Ser. No. 10/126,832 that was filed on Apr. 18, 2002 now U.S. Pat. No. 6,965,506, from which priority under 35 U.S.C. § 120 is claimed, entitled "System and Method for Dechucking a Workpiece for an Electrostatic Chuck" which is a continuation-in-part of Ser. No. 09/163,368, now U.S. Pat. No. 6,790,375 that was filed on Sep. 30, 1998 and entitled "Dechucking Method and Apparatus for Wafers in Vacuum Processors." U.S. patent application Ser. No. 10/126,832 is also a nonprovisional patent application claiming priority from U.S. Provisional Patent Application No. 60/322,580 filed on Sep. 14, 2001, entitled "A Dechucking Algorithm for Electrostatic Chucks With Voltage Polarity Reversal." All of these aforementioned patent applications are hereby incorporated by reference.

U.S. patent application Ser. No. 10/882,837, filed on Jun. 30, 2004, entitled "Method of Determining the Correct Average Bias Compensation Voltage During A Plasma Process" is also a continuation-in-part of U.S. Pat. No. 6,790,375, filed on Sep. 30, 1998, from which priority under 35 U.S.C. § 120 is claimed, entitled "Dechucking Method and Apparatus for Workpieces in Vacuum Processors."

BACKGROUND OF THE INVENTION

1. Field of the Invention

The present invention is related to processing of dielectric or semiconductor materials. More particularly, the invention is related to releasing a dielectric or semiconductor wafer from an electrostatic chuck.

2. Description of the Related Art

During the process of wafer processing or glass processing, an electrostatic chuck (ESC) is used to clamp the semiconductor or dielectric wafer to a metal holder. The ESC operates like a capacitor in that a static charge is built up between the wafer and the metal holder to clamp or secure the wafer on the metal holder. The process of semiconductor or dielectric processing deposits a substantial amount of power on the wafer. In order to cool the wafer during processing, a heat transfer medium is needed to transfer heat from the wafer to a heat sink. The heat sink is a metal holder which is water cooled. The heat transfer medium is a gas such as helium which is capable of transferring heat from the wafer to the water-cooled metal holder. The ESC is the preferred clamping device to hold the wafer against the metal holder. Upon completion of the processing, the wafer must be removed from the metal holder. A residual sticking force remains between the ESC and the wafer after the clamping force has been turned off. The process of removing the wafer due to this sticking force is referred to as "dechucking" or declamping the wafer. The dechucking process is complicated by the variation in dechucking values for each individual ESC. Therefore, the dechucking values used for one ESC do not necessarily work for another ESC, even if each ESC is made by the same manufacturer using the same materials. Additionally, a single ESC has electrical properties that depend on temperature, so the dechucking values at one temperature do not necessarily work for the same ESC at a different temperature. In addition to variations from one chuck to another, and variations of a given chuck with temperature, the optimum dechucking conditions (the voltage offsets more than the pole-to-pole voltage magnitudes) can also depend on the type of wafer being processed and even on the recipe used to do the processing.

Therefore, a system and method for dechucking is needed that takes into consideration the electrical properties for each ESC.

SUMMARY OF THE INVENTION

Broadly speaking, the present invention fills these needs by providing a substrate processing apparatus that is capable of dechucking the substrate in an intelligent manner. It should be appreciated that the present invention can be implemented in numerous ways, including as a process, an apparatus, a system, a device or a method. Several inventive embodiments of the present invention are described below.

In one embodiment, a method for removing a substrate that is attached to a bipolar electrostatic chuck (ESC) by application of a bipolar ESC voltage is provided which includes discontinuing the bipolar ESC voltage after processing a current substrate, and determining a monopolar component error of the processing. The method also includes correcting the monopolar component error for a subsequent substrate.

In another embodiment, a method for removing a substrate that is attached to a bipolar electrostatic chuck (ESC) by application of a bipolar ESC voltage is provided which includes discontinuing the bipolar ESC voltage after processing a current substrate, and determining a monopolar component error of the processing. The method also includes compensating for the monopolar component error for the substrate.

In yet another embodiment, an apparatus for processing a substrate is provided which includes a bipolar electrostatic chuck (ESC) capable of holding the substrate with an electrical force from a bipolar ESC voltage and an ESC clamping voltage power supply capable of applying at least one of the bipolar ESC voltage, a bias compensation voltage, and a reverse polarity voltage to the bipolar ESC. The apparatus also includes a computing device capable of managing the ESC clamping voltage power supply and capable of at least one of compensating for a monopolar component error and correcting for the monopolar component error.

The advantages of the present invention are numerous. Most notably, the apparatuses and methods described herein generate intelligent and effective dechucking of a wafer in either one of two ways. In one embodiment, errors in a bias compensation voltage and/or a reverse polarity voltage (RPV) may be determined and the bias compensation voltage and/or the reverse polarity voltage may be adjusted in a subsequent wafer processing operation so the error(s) does not occur and dechucking may proceed in an optimal manner. In another embodiment, an error in the bias compensation voltage may be detected before the current wafer is dechucked. Therefore, after the bias compensation voltage error is detected, an RPV with an offset voltage may be applied to the ESC so the current wafer may be dechucked in an optimal manner.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION

An invention for methods and apparatuses for processing a substrate is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

While this invention has been described in terms of several preferable embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

This invention provides a system and method for determining the dechucking parameters for an electrostatic chuck (ESC). During the dechucking process a reverse polarity voltage is applied for a time period. It shall be appreciated by those skilled in the art that if the ESC bias compensation voltage is not correct (either too small or too high), then the ESC clamping voltage is effectively different for the two poles, and the same reverse polarity voltage magnitude can be simultaneously too high for one pole and too low for the other.

Figure 1:
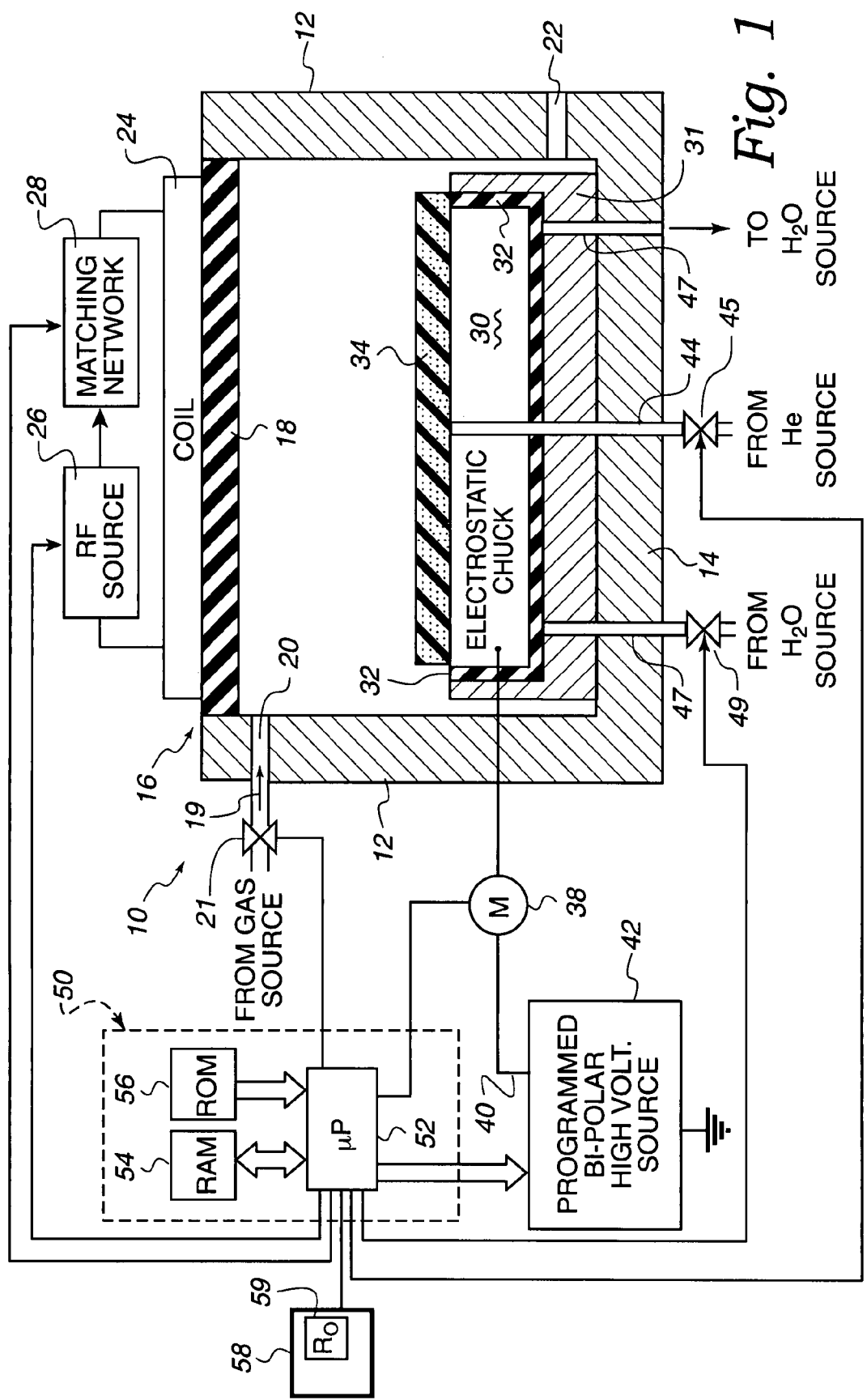
FIG. 1 shows an illustrative plasma processor that can be used for etching a wafer or for depositing films on the wafer in a chamber having sidewalls in accordance with one embodiment of the present invention.

FIG. 1 shows an illustrative plasma processor that can be used for etching a wafer or for depositing films on the wafer in a chamber 10 having sidewalls 12 in accordance with one embodiment of the present invention. An illustrative plasma processing system capable of chucking and dechucking a wafer is described. The chamber 10 may be a vacuum chamber which includes a bottom end plate 14 and top end plate structure 16 with a dielectric window 18. Sealing of these exterior surfaces can be provided with conventional gaskets (not shown).

A suitable gas that can be excited to a plasma is supplied to the interior of chamber 10 from a gas source (not shown) via line 19, port 20 and valve 21. A plasma is an electrically neutral, ionized gas composed of ions, electrons, and neutral particles. The interior of chamber 10 is maintained in a vacuum condition by a vacuum pump connected to port 22 in sidewall 12. It shall be appreciated by those of ordinary skill in the art that the port 22 may also be located at the bottom of the chamber. The gas in vacuum chamber 10 is excited to a plasma condition by a suitable electric source, such as planar coil 24, mounted above window 18 and excited by RF source 26 via matching network 28.

An illustrative electrostatic chuck (ESC) 30 can be fixedly mounted in chamber 10 on support structure including grounded metal base 31 that is electrically decoupled from the chuck by electrical insulating sheets 32; base 31 may be fixed to bottom end plate 14. ESC 30 may be particularly designed to selectively hold a wafer 34. Generally, the wafer 34 is either a semiconductor wafer or a glass dielectric or any other suitable material or a combination of materials.

Figure 2:
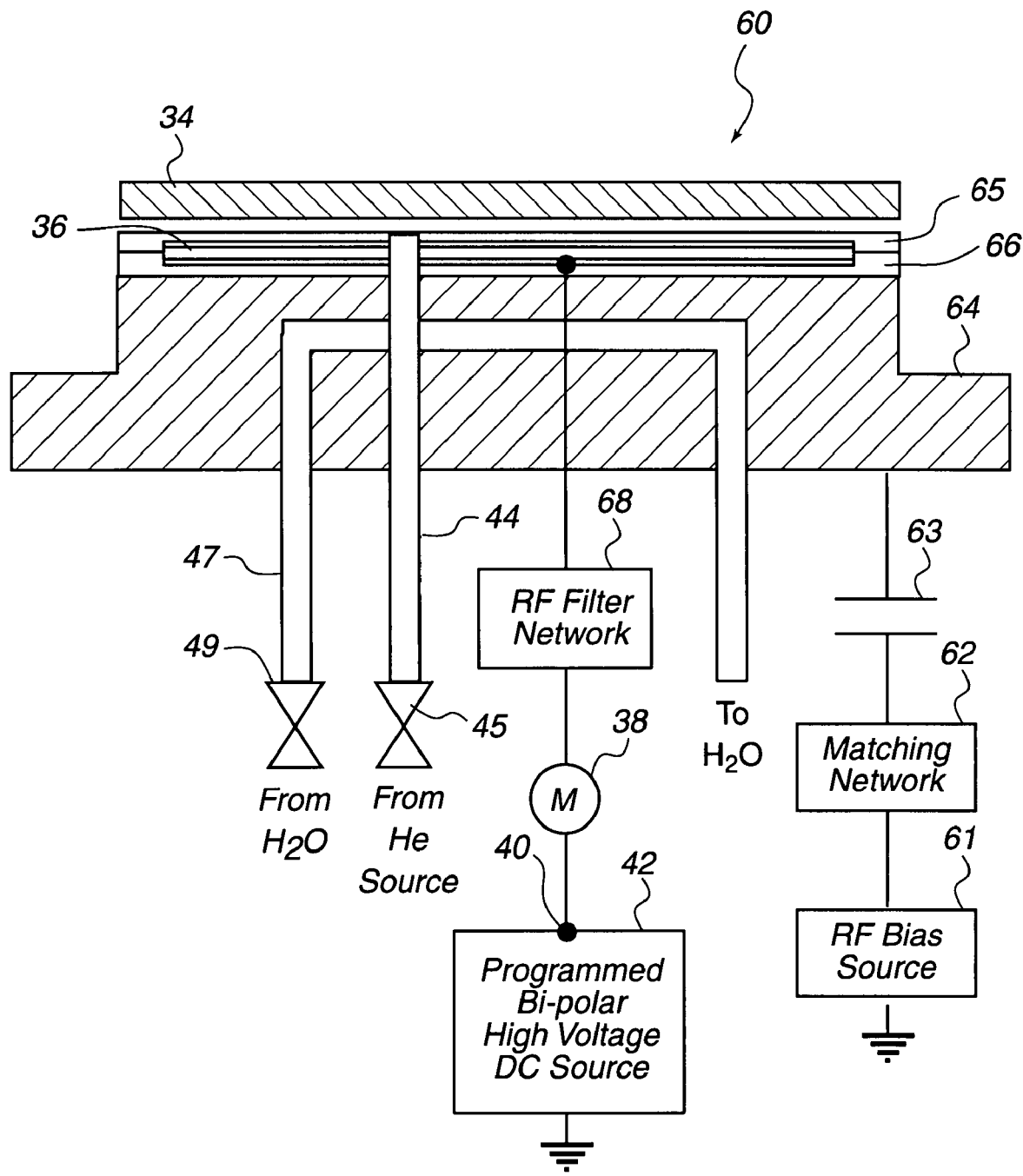
FIG. 2 shows an illustrative monopolar ESC housed by the processing chamber of FIG. 1 in accordance with one embodiment of the present invention.

Referring to FIG. 2 there is shown an exploded view of an illustrative monopolar electrostatic chuck operatively coupled to wafer 34. During the chucking process (e.g., a wafer clamping process) and the dechucking process, (e.g., a wafer declamping process), a sensor 38 can monitor an ESC electrical property between electrode 36 and voltage source 42. By way of example and not of limitation, the ESC electrical property monitored by sensor 38 can be the current between electrode 36 and voltage source 42. Thus in the example, the sensor 38 may be an ammeter configured to measure current. Additionally, the sensor 38 may also measure other ESC electrical properties such as voltage, resistance, capacitance, inductance, impedance and any other such electrical property. The sensor 38 may be disposed between electrode 36, and terminal 40 of source 42. As described below, a computer is configured to receive the output from sensor 38 and controls the chucking and dechucking forces applied to ESC 30.

Referring back to FIG. 1, the temperature of wafer 34 is controlled by supplying helium gas from a suitable source (not shown) via conduit 44 and valve 45 through ESC 30 to the wafer back face, i.e., to the face of the wafer not exposed to the ions in the processing chamber 10, and by supplying a coolant liquid to ESC 30 via conduits 47 and valve 49 from a suitable source (not shown). The pressure of the gas applied to the back face of wafer 34 is sufficient to push wafer 34 off ESC 30 if there is little or no sticking force between the ESC 30 and the wafer 34. The helium gas cools wafer 34 by transferring heat, between the wafer and ESC 30. ESC 30 acts as a relatively cool heat sink because of the liquid coolant flowing to it via conduit 47. The main purpose of the ESC 30 is to control the temperature of the wafer. In addition, "temperature control" may mean either cooling the wafer or heating the wafer.

The back face of wafer 34 abuts a flat planar face of ESC 30, except in portions of the chuck face that are grooved. ESC 30 applies a force to the wafer 34 so the exposed surface of the wafer is flat and lies in a plane substantially parallel to the ESC flat planar face. ESC 30 is also constructed so the helium gas contacts a substantial portion of the back face of wafer 34.

During operation, the wafer 34 is clamped or chucked to the ESC 30 by clamping voltages generated from source 42. Since the charge stored on the illustrative wafer 34 is sufficiently large to prevent the wafer from being removed from ESC 30, a reverse polarity voltage is applied to the ESC 30 to remove the residual charge that remains stored on the wafer 34. Thus, the reverse polarity voltage is generated by power source 42 and applied for a particular period of time to cancel the residual charge on the wafer 34. The process of removing the wafer 34 from the ESC is referred to as "dechucking."

The computer system 50 includes microprocessor 52, random access memory (RAM) 54 and read only memory (ROM) 56, controls the amplitude of a time varying voltage derived by source 42, opening and closing of valves 21, 45 and 49, as well as turning on and turning off of RF source 26 and the reactive impedances of matching network 28. Microprocessor 52 responds to a program stored in ROM 56, to signal values stored in RAM 54, and to the amplitude of the current in the pulse sensed by sensor 38 to control valves 21, 45, 49 high voltage source 42 and RF source 26. In addition, microprocessor 52 responds to values of (1) output power of source 26 and (2) power reflected back to the source, as derived from suitable transducers (not shown), to control the reactances of matching network 28.

FIG. 2 shows an illustrative monopolar ESC 60 housed by the processing chamber 10 of FIG. 1 in accordance with one embodiment of the present invention. The ESC 60 is connected to the high voltage terminal 40 of a programmed DC source 42. During initial processing of wafer 34 in chamber 10, the voltage at terminal 40 can reach several thousand volts. For the ESC 60, the voltage source 42 may be constructed so terminal 40 is at either a negative or positive voltage relative to the voltage at ground. Additionally, a radio frequency (RF) bias voltage is supplied to chuck 60 for ion energy control. To this end, RF source 61 is connected via matching network 62 and series DC blocking capacitor 63 to metal base 64 of ESC 60. The RF voltage causes wafer 34 to become charged to a negative DC voltage because the highly mobile plasma electrons are attracted to the ESC to a much greater extent than the low mobility heavy plasma ions. The front of electrode 36, i.e. the face of the plate closest to wafer 34, is covered by an electrically resistive material 65, preferably formed as a layer completely covering the plate 36 front face. The remainder of plate 36 is surrounded by insulating layer 66, preferably made of a ceramic material. Insulating layer 66 is bonded to metal base 64. The temperature of metal base 64 is controlled by flowing a heating/cooling fluid through channel 47 in the metal base 64.

After wafer 34 has been placed on resistive layer 65, DC voltage source 42 is turned on to a non-zero value, typically in the range of a few hundred to a few thousand volts. Heat transfer gas is then supplied via conduit 44 to the gaps between wafer 34 and resistive layer 65.

In operation, after programmable DC power supply 42 is engaged, charge flows to the electrode 36 through ammeter 38 and RF filter network 68. After traveling through electrode 36, the charge proceeds through the resistive layer 65 and then through the contact between the resistive layer 65 to the wafer 34. From wafer 34, the charge then travels through the plasma to the chamber walls (not shown) and back to the ground terminal of programmable DC power supply 42. The flow of charge through the contact between the resistive layer 65 and the wafer 34 comprises the flow of free charge and the flow of displacement charge. The flow of displacement charge between the resistive layer 65 and the wafer 34 leaves a net charge of one polarity on the electrode 36 and resistive layer 65, and a net charge of the opposite polarity on wafer 34. The attractive force between the two net charges of opposite polarity clamps the wafer 34 to the ESC 60.

During the dechucking process, the application of a reverse polarity voltage from programmable DC voltage supply 42 speeds the reverse flow of current through resistive layer 65. In one embodiment, the reverse polarity voltage is applied at a specified magnitude for a variable period of time. In an alternative embodiment, the reverse polarity voltage is applied at a variable magnitude for a specified period of time.

Figure 3:
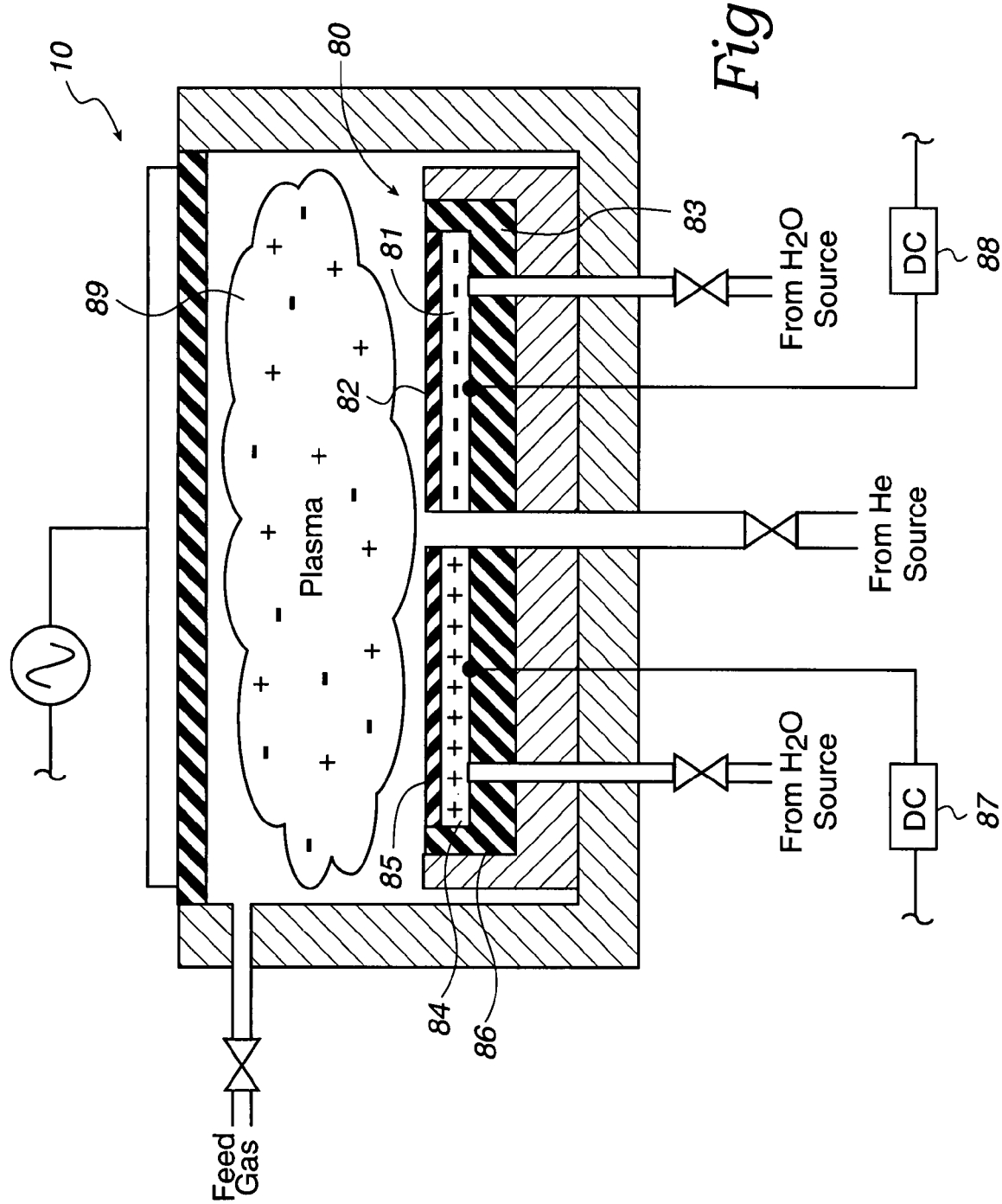
FIG. 3 shows an illustrative bipolar ESC that may also be used in the chamber of the illustrative plasma processor in accordance with one embodiment of the present invention.

FIG. 3 shows an illustrative bipolar ESC 80 that may also be used in the chamber 10 of the illustrative plasma processor in accordance with one embodiment of the present invention. The illustrative bipolar ESC 80 includes a first plate 81 embedded within dielectric layers 82 and 83, and a second plate 84 embedded within dielectric layers 85 and 86. When a chucking voltage is applied to the two electrodes via power supplies 87 and 88, a small current flows between the electrodes and through the wafer (not shown) so that opposite charges accumulate on the surface of the two plates 81 and 84. These charges establish an electrostatic effect between the bipolar ESC 80 and the wafer (not shown). It shall be appreciated by those skilled in the art that the power supplies are operatively coupled to the computer system 50 shown in FIG. 1.

By using the apparatus and methods described below in reference to Figures through 4 through 11, one can determine whether the average bias compensation voltage during a process was too high or too low. A bipolar ESC can be considered as two capacitors, one between the wafer and the positive pole of the ESC, and the other between the wafer and the negative pole of the ESC. Usually the values of the two capacitors are the same. If the bias compensation voltage is equal to the wafer bias voltage, the amounts of charge stored on the two capacitors during a process is equal. But if the bias compensation voltage is not equal to the wafer bias voltage, then the charges on the two capacitors will not be the same, and one discharge current at the end of the process will be larger than the other (assuming that the plasma is on). Which discharge current is larger and which is smaller will depend on whether the bias compensation voltage was too large or too small relative to the wafer bias voltage. In this method the bias compensation error can be detecting during dechucking. Therefore, for a subsequent wafer processing operation, monopolar component errors such as, for example, the ESC bias compensation voltage errors can be corrected by adjusting the ESC bias compensation voltage, changing the ESC reverse polarity voltage, and/or adjusting an offset ESC voltage applied to a subsequent wafer during dechucking.

In another embodiment, the bias compensation error can be detected before dechucking takes place. The discharge current from a negative pole and a positive pole of the ESC can be detected initially after the ESC is powered down but before the RPV is applied. By comparing the current discharge between the negative pole and the positive pole from the bipolar ESC, one can determine whether the bias compensation voltage was too low or too high. In such a circumstance, an offset voltage may be applied so the effective RPV applied to the positive pole and the negative pole may be adjusted to compensate for the bias compensation. In addition, the bias compensation voltage error may be corrected on subsequent wafers by adjusting the ESC bias compensation voltage, adjusting the ESC reverse polarity voltage, and/or adjusting an ESC offset voltage.

Figure 4:
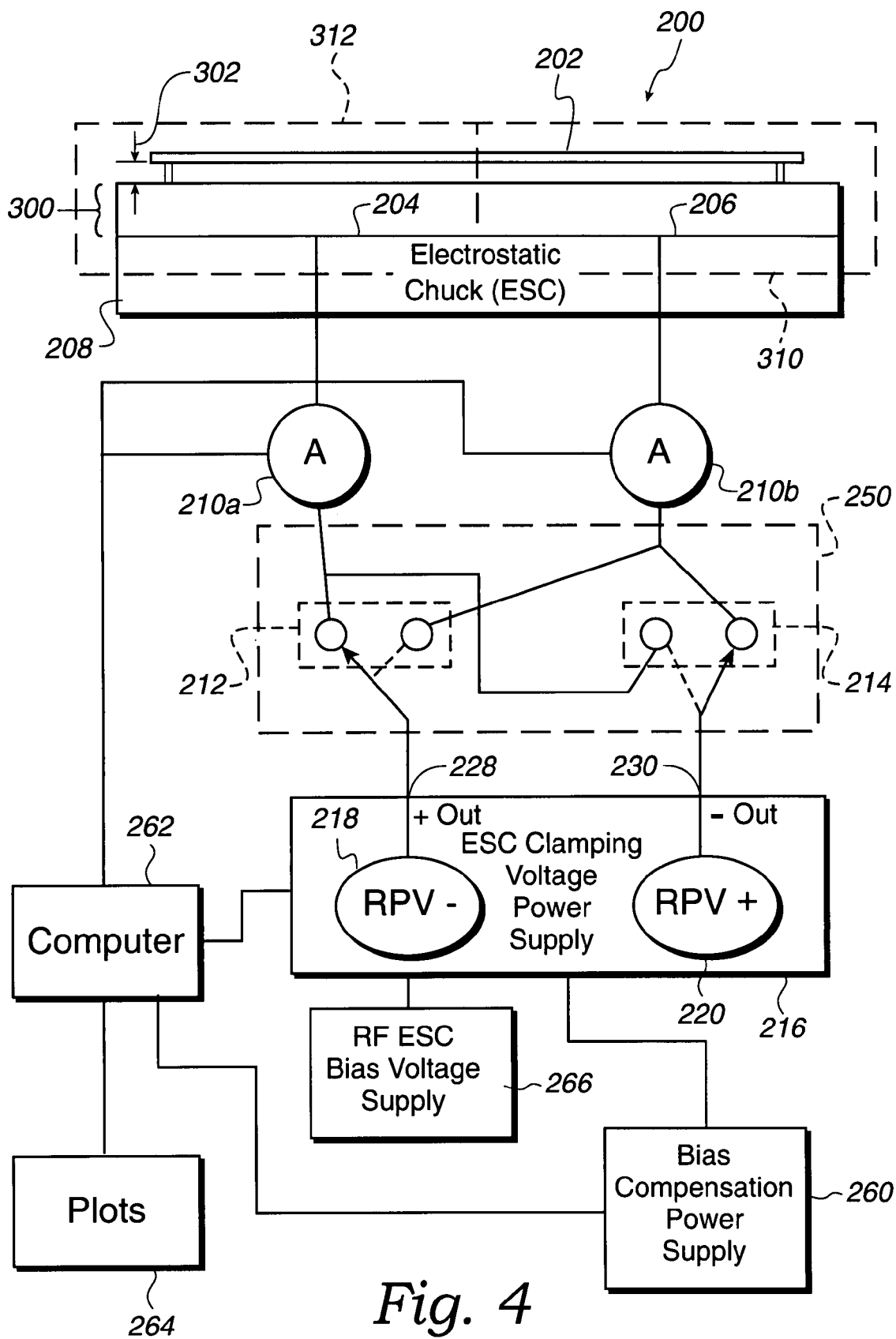
FIG. 4 illustrates a wafer processing apparatus in accordance with one embodiment of the present invention.

FIG. 4 illustrates a wafer processing apparatus 100 in accordance with one embodiment of the present invention. In one embodiment, the wafer processing apparatus 200 includes a wafer 202 held by a bipolar electrostatic chuck (ESC) 208. The ESC 208 includes a negative pole 204 and a positive pole 206 through which voltage may be applied to generate an electrostatic field to clamp the wafer 202 to the ESC 208. It should be appreciated that the ESC 208 may be any suitable electrostatic chuck configuration that can implement the methods described herein to dechuck the wafer 202 in an optimal manner without having to use excessive dechucking force. In the embodiment shown in FIG. 4, the ESC 208 may be a part of capacitors 310 and 312 where the poles 204 and 206 are conductive plates of the capacitors 312 and 310 respectively. In such a configuration, the wafer 202 may be the other conductive plate of the capacitors 310 and 312, and a width 300 of a material making up the ESC 208 and a gap 302 between the ESC 208 and the wafer 202 can be the dielectric of the capacitor.

The poles 204 and 206 may each be connected to ammeters 210a and 210b respectively. The ammeters 210a and 210b can detect an amount of current flowing to and from the poles 204 and 206. The ammeters 210a and 210b may also be connected to a relay system 250. The relay system 250 can include switches 212 and 214 which can connect either of the ammeters 210 with either of the positive voltage output 228 and negative voltage output 230 from the ESC Clamping Voltage Power Supply (ESC CVPS) 216. By using the relay system 250 to switch the polarities of the voltages, the ESC CVPS 216 can apply a clamping voltage and a reverse polarity voltage (as compared with the clamping voltage) to each of the positive pole 206 and the negative pole 204. Therefore, in one embodiment, the negative output 230 from the ESC CVPS 216 can apply a negative charge to the negative pole 206 and the positive output 228 can apply a positive charge to the positive pole 204.

The CVPS 216 can apply any suitable amount and type of voltages to the ESC 208. In one embodiment, the CVPS can apply an RF voltage from an RF ESC bias voltage supply 266 to the ESC 208 for wafer processing (such as, for example, wafer etching), a DC voltage for wafer clamping, and a bias compensation voltage from the bias compensation power supply 260 for enhanced wafer clamping through the compensation of voltage clamping irregularities resulting from charge buildup on the wafer surface during an etching operation. Unfortunately, there are times when the bias compensation voltage is not correct for a variety of reasons and there is a need to correct for the voltage irregularities.

The negative DC voltage on the wafer resulting from the RF voltage is called the wafer bias voltage. The presence of the wafer bias voltage changes the voltage difference between the ESC pole and the wafer. For a bipolar ESC, it makes the voltage difference larger for one pole and smaller for the other. In an effort to keep these voltage differences constant, the ESC voltages are changed by an amount called the "bias compensation voltage", where the value of the bias compensation voltage is chosen to approximate the true wafer bias voltage. In an ideal bipolar ESC, the positive and negative charges on the wafer (located over the negative and positive poles of the ESC, respectively) have exactly the same magnitude so that there is no net charge on the wafer. An error in bias compensation (i.e., a bias compensation voltage not exactly equal to the true wafer bias voltage) results in an imbalance between the positive and negative poles and a non-zero net charge on the wafer. This non-zero net charge can be a cause of wafer sticking. By improving the accuracy of the bias compensation voltage, this source of wafer sticking can be eliminated and wafer dechucking can be improved.

In addition, the CVPS 216 can also output a positive reverse polarity voltage (RPV) 218 and a negative RPV 220 during an active dechucking process. The reverse polarity voltage may be applied to the poles 204 and 206 to decrease the time required for the current discharge from the capacitor 310 to dissipate. In one embodiment, the switches 212 and 214 within the relay 250 may be changed so that the positive RPV 220 outputted through the negative output 230 may be applied to the positive pole 204, and the negative RPV 218 outputted through the positive output 228 can be applied to negative pole 206.

The ESC CVPS 216 may also be connected to a Bias Compensation Power Supply 260 which can supply the ESC CVPS 216 with a voltage to be utilized to generate the bias compensation voltage. The ESC CVPS 216 is further connected to a computer 262 which can manage the chucking/dechucking process and therefore determine when certain voltages are applied to the poles 204 and 206 through the ESC CVPS 216. The computer 262 can generate plots 264 which can show in an empirical sense the status of the wafer chucking and dechucking. In one embodiment, the computer can process the current application and discharge data from the ammeters 210 to generate a plot of current discharges from the poles 204 and 206 against time during a chucking and/or dechucking process as shown below in FIGS. 5A through 9B.

During wafer processing such as, for example, a wafer etching operation, RF voltage may be applied to the positive pole 204 and the negative pole 206. It should be appreciated that the RF voltage may be applied in any suitable manner as those known by those skilled in the art. The application of RF voltage along with plasma can impart a negative charge to a wafer surface. As known to those skilled in the art, such application of negative charge to the wafer surface can generate a wafer bias voltage which can create an uneven clamping voltage to the wafer (e.g., different clamping voltages at the poles 204 and 206). To negate the wafer bias voltage, a bias compensation voltage that is of equal voltage to the wafer bias voltage can be applied to the poles 204 and 206. Unfortunately, the bias compensation voltage is often incorrect due to varying and difficult to control wafer processing conditions and therefore, the bias compensation voltage oftentimes does not fully compensate (or overcompensates) for the wafer bias voltage. In addition, the RPV applied to the poles 204 and 206 during a dechucking process may be incorrect as shown below in reference to FIGS. 7A through 7C.

In one embodiment, a bias compensation error and/or the effects of the RPV that was applied can be detected as the wafer 202 is being dechucked. In one exemplary wafer processing situation, when the dechucking occurs, the charges on the two capacitors 310 and 312 will not be the same, and one discharge current at the end of the process will be larger than the other. Data regarding the electrical discharge can be directed to the computer 262 which can plot the electrical discharge from the positive pole 206 and the negative pole 204. Therefore, as discussed below in reference to FIGS. 7A to 9B, the bias compensation voltage error and/or the error in the magnitude of RPV applied can be detected during the dechucking process. In this way, the computer and/or a user can determine whether the bias compensation and/or the RPV applied to the system was too low or too high and then adjust the Bias Compensation Power Supply 260 to apply the correct bias compensation voltage and/or adjust the RPV 218 and 220 to correct the RPV applied in a subsequent wafer. Therefore, by examining the ESC current discharge during dechucking, the bias compensation voltage and/or the RPV may be adjusted on subsequent wafers to optimize dechucking.

Therefore, when the bias compensation voltage is too low, the bias compensation voltage may be increased for a subsequent wafer operation. Conversely, when the bias compensation voltage is too high, the bias compensation voltage may then be decreased for a subsequent wafer operation. In addition, with regard to RPV errors, when the RPV is found to be too low during the dechucking process, the RPV may be increased for a subsequent wafer processing operation. In addition, when the RPV is found to be too high during the dechucking process, the RPV may be increased for a subsequent wafer processing operation.

Figure 9A:
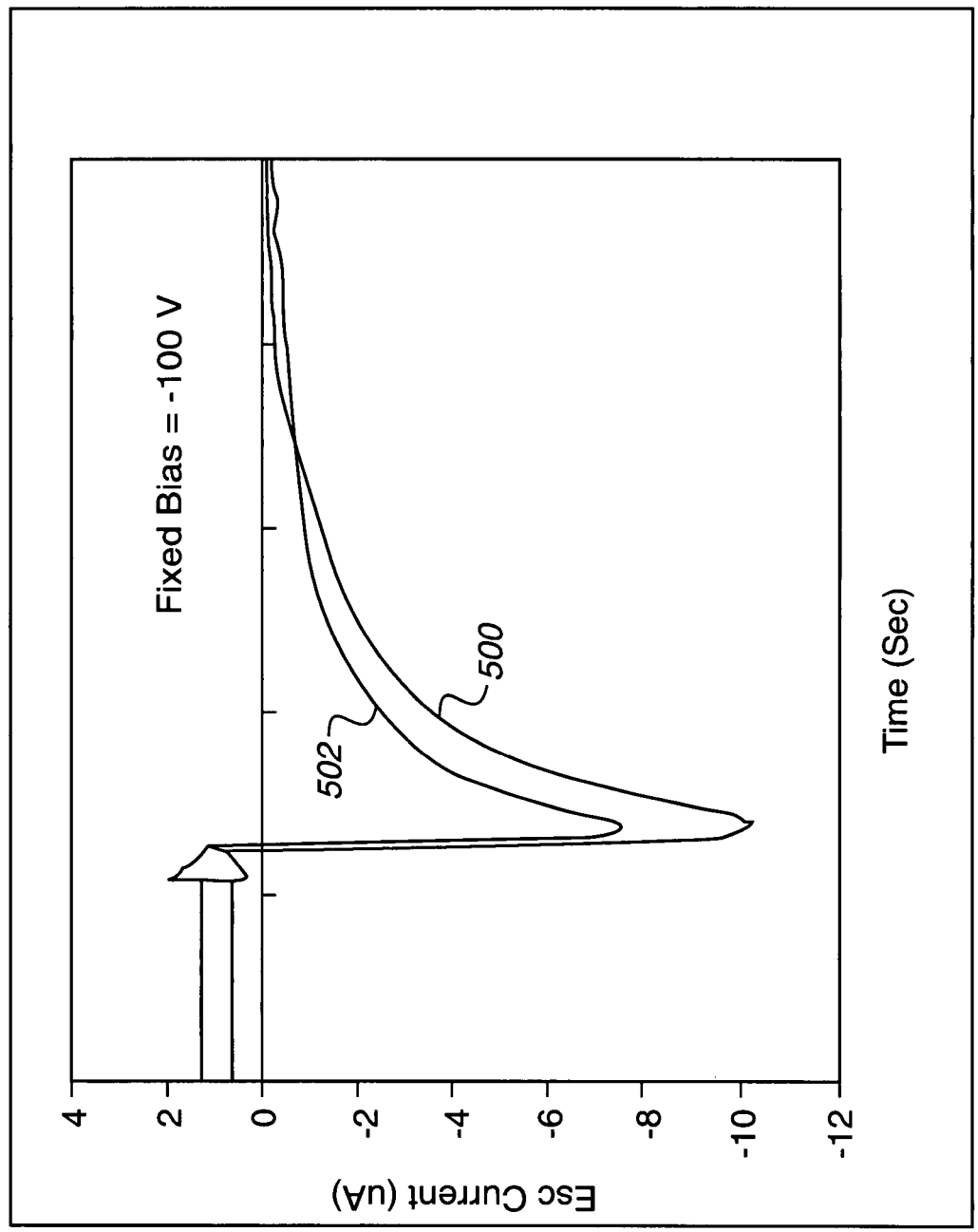
FIG. 9A illustrates a close-up view of current discharge profiles of currents from a negative pole and a positive pole from a bipolar ESC where the bias compensation was too low in accordance with one embodiment of the present invention.
Figure 9B:
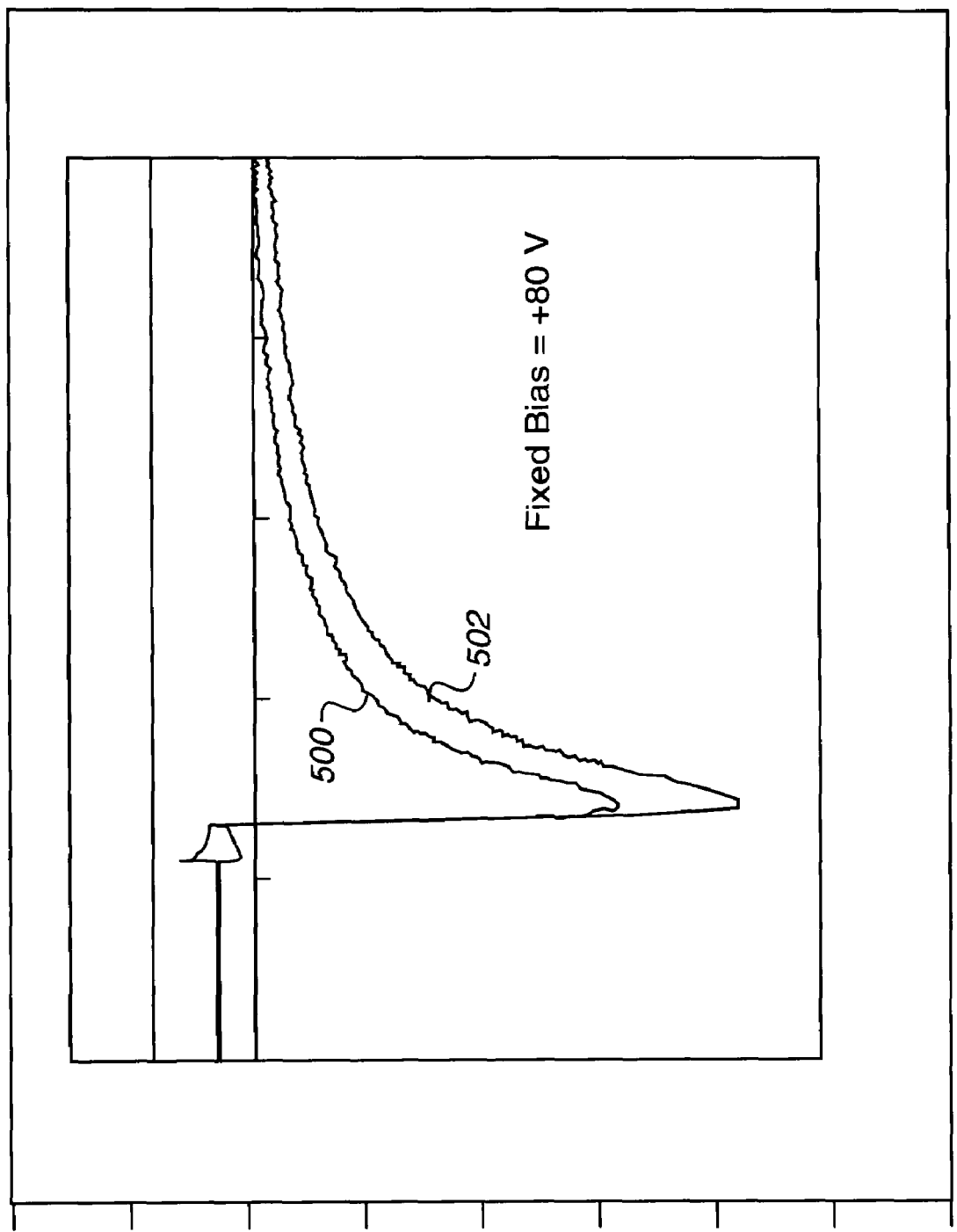
FIG. 9B illustrates a close-up view of current discharge profiles of currents from a negative pole and a positive pole from a bipolar ESC where the bias compensation was too high in accordance with one embodiment of the present invention.

In another embodiment, the bias compensation error can be detected after the ESC power has been turned off and before the RPV has been applied to the positive pole 206 and the negative pole 204. In one embodiment, the bias compensation error can be detected by examining the current discharge from the poles 204 and 206 after the ESC has been turned off and before the RPV is applied. Such a comparison can be made by examining the plot of current discharges from the positive pole 206 and the negative pole as discussed in reference to FIGS. 9A and 9B. In this embodiment, the wafer 202 from which the current discharge readings are taken can be electrically processed by an offset voltage so one pole of the ESC 208 has a different RPV applied compared to the other pole of the ESC 208. Therefore, in one bias compensation correction method, when a plot of an ESC current discharge as shown in FIGS. 9A and 9B are plotted and it is discovered that the bias compensation voltage was not correct, the effect of the bias compensation voltage can be corrected by application of an RPV with an offset voltage poles 204 and 206. It should be appreciated the RPV with the offset voltage may be applied in any suitable manner that can correct the effect of the bias compensation voltage error. In one embodiment, the RPV with the offset voltage may be applied by application of different RPV voltages to the positive pole 206 and the negative pole 204. In another embodiment, the same magnitude of RPV may be applied to the poles 204 and 206 while an additional offset voltage may be applied to the poles 204 and 206 (different voltage to different poles) to correct for the unequal clamping voltage applied by the poles 204 and 206.

It should be appreciated that the configuration of the ESC 208 is exemplary in nature and that any other suitable type of the wafer processing apparatus 100 may be utilized that can implement the methodology described herein to reduce current discharge spiking from the positive pole and the negative pole that occurs when uneven clamping voltage exists on different parts of the wafer during a dechucking process. Consequently, the configuration of the apparatus 100 may be any suitable design and construction as long as the voltages applied to the positive pole 206 and the negative pole 204 may be managed and controlled as described herein.

FIGS. 5A through 9B show computer generated plots of ESC current discharges from the negative pole and the positive pole of the bipolar ESC plotted against time. It should be appreciated that although the polarities of the discharges from the positive and negative poles appear to be the same, that in actuality the polarities are opposite to each other (e.g., if polarity were used in the plotting, the plots for the current discharges for the two poles would be near mirror images of each). The curves are shown as having the same polarity (curves being on the same side of the y-axis) to better show the differences in magnitude of the current discharges from the two poles.

Figure 5A:
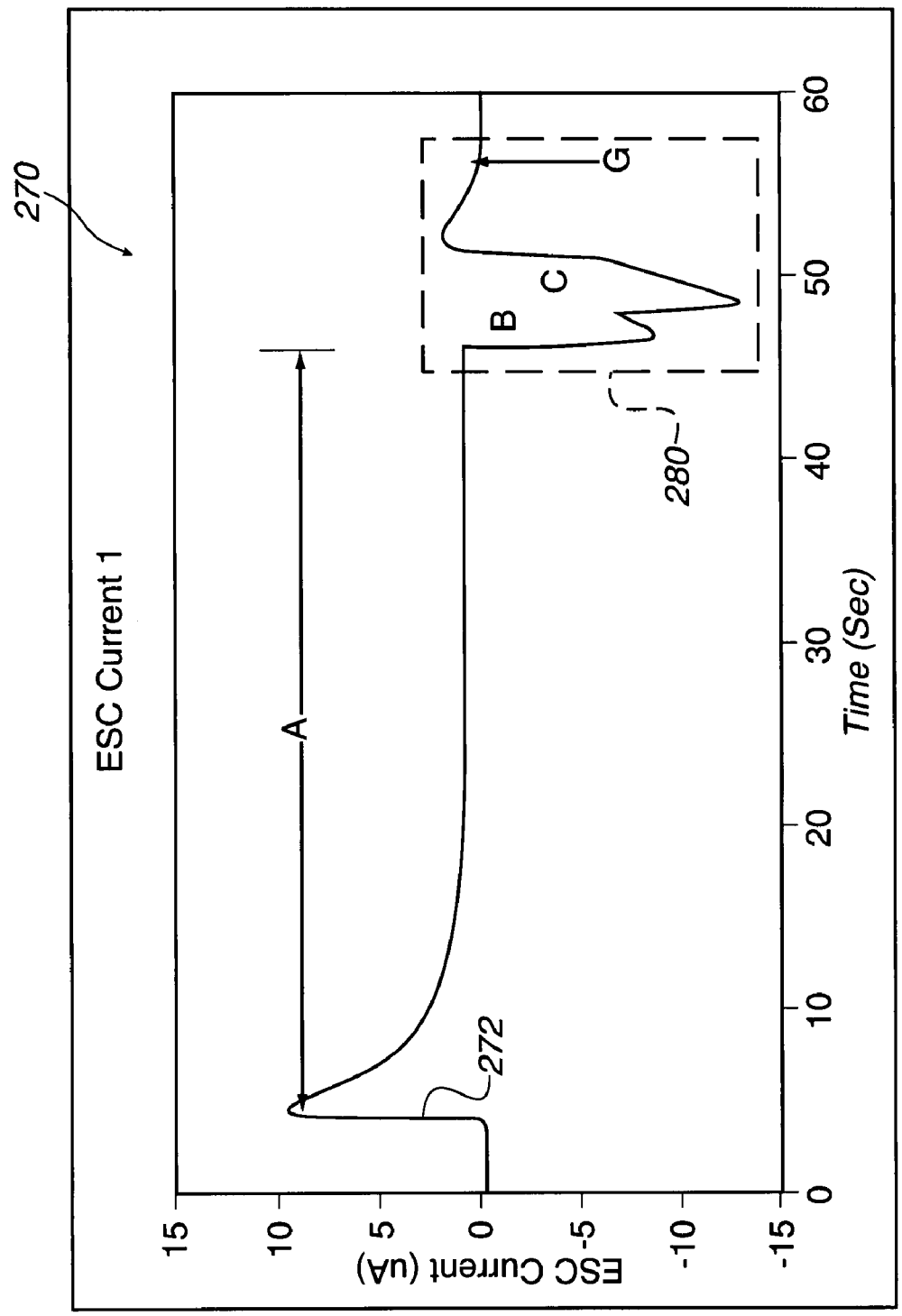
FIG. 5A shows a plot of an ESC discharge current from a bipolar ESC from ESC power-on to dechucking in accordance with one embodiment of the present invention.

FIG. 5A shows a plot 270 of an ESC discharge current from a bipolar ESC from ESC power-on to dechucking in accordance with one embodiment of the present invention. In one embodiment, the plot 270 starts where the ESC power is turned on at point 272. After the ESC power is turned on the current from one of the poles is relatively constant until region 280 is reached. Region 280 depicts the current discharge fluctuations that occur from the positive pole and the negative pole of the ESC when ESC power is turned off and a dechucking process occurs. The region 280 is described in further detail in reference to FIG. 5B.

Figure 5B:
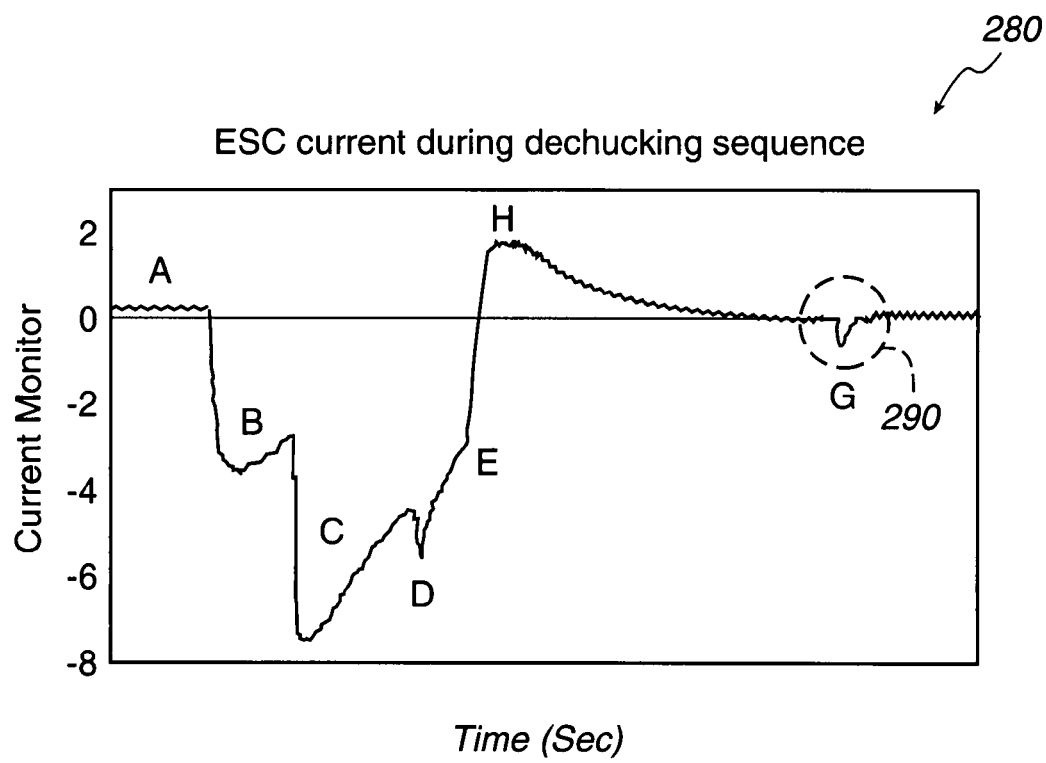
FIG. 5B illustrates a region which shows a plot of a measured ESC current during a dechucking process in accordance with one embodiment of the present invention.

FIG. 5B illustrates a region 280 which shows a plot of a measured ESC current during a dechucking process in accordance with one embodiment of the present invention. Region A corresponds to a steady-state ESC current for a chucked wafer. In region B, the ESC voltage (e.g., DC clamping voltage) is turned off therefore stopping the DC voltage to a first pole and a second pole in a bipolar ESC system. At region B, the current and the current magnitude starts to decay to 0.

In one embodiment, as discussed in further detail in reference to FIGS. 9A and 9B, the current discharge plots for each of the first pole (e.g., positive pole) and the second pole (e.g., negative pole) can be examined to determine whether the bias compensation voltage was too high or too low. Unless the bias compensation voltage is correct, different clamping voltages can exist at the first pole and the second pole. Therefore, if the bias compensation voltage is found to be incorrect at region B, an RPV voltage with an offset voltage can be applied to the first pole and/or the second pole to compensate for the bias compensation voltage.

In one embodiment, at region C, an RPV is applied which drives the ESC current to the maximum negative current magnitude. The negative current magnitude then begins to decay to a steady-state negative value while the RPV is applied. At region D, a spike is generated while the RPV is being applied. The spike in region D corresponds to movement of the wafer caused by residual helium pressure between the wafer and the ESC. The current spike at "D" introduces a degree of wafer-to-wafer variation into the dechucking process. If the helium pressure under the wafer is low enough at this time, then spike "D" may be avoided. At region E, the RPV is turned off. Depending on the dechucking conditions and parameters, the current then goes to some value at region H that is either positive or negative and then begins to decay towards 0.

At region G, the wafer can be lifted and the current spike occurs. The current spike measurement at region G indicates whether the bias compensation voltage and/or the RPV were too high or too low. In one embodiment, whether the bias compensation voltage is incorrect can be determined by examining the plots for the current discharge as discussed in reference to FIGS. 8A through 8B. In another embodiment, whether the RPV was incorrect can be determined by examining the plots for the current discharge from the two poles as discussed in reference to FIGS. 7A through 7C. Therefore, by examining the current spikes in region G, the bias compensation voltage for subsequent wafers may be adjusted so the spikes do not occur. When no spikes occur, the bias compensation voltage was just right and excessive force was not necessary to declamp the wafer.

Figure 6:
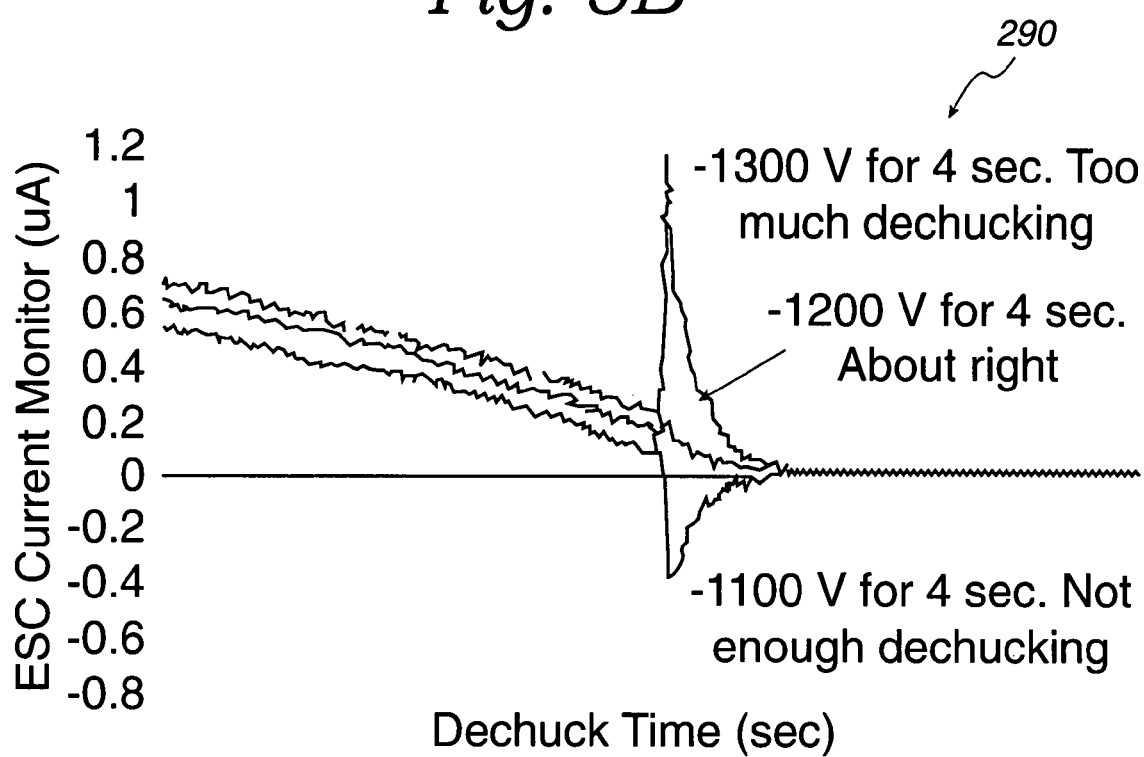
FIG. 6 shows a magnified illustrative plot of the current spike at region G of FIG. 5 in accordance with one embodiment of the present invention.

FIG. 6 shows a magnified illustrative plot of the current spike at region G of FIG. 5 in accordance with one embodiment of the present invention. The plot shows the results associated with the dechucking parameters (e.g., bias compensation voltage, RPV, etc.) being too high, and the dechucking parameters being too low, and the dechucking parameters being just right. The dechucking parameters are appropriate when the current discharge spike is close to zero. In one embodiment, the current spike having a positive current can result from the dechucking parameters being too high (e.g., RPV too high). On the other hand, the current spike having a negative current resulting from the dechucking parameters being too low (e.g. the RPV too low). The appropriate dechucking parameters generate little or no current spike at region G.

Figure 7A:
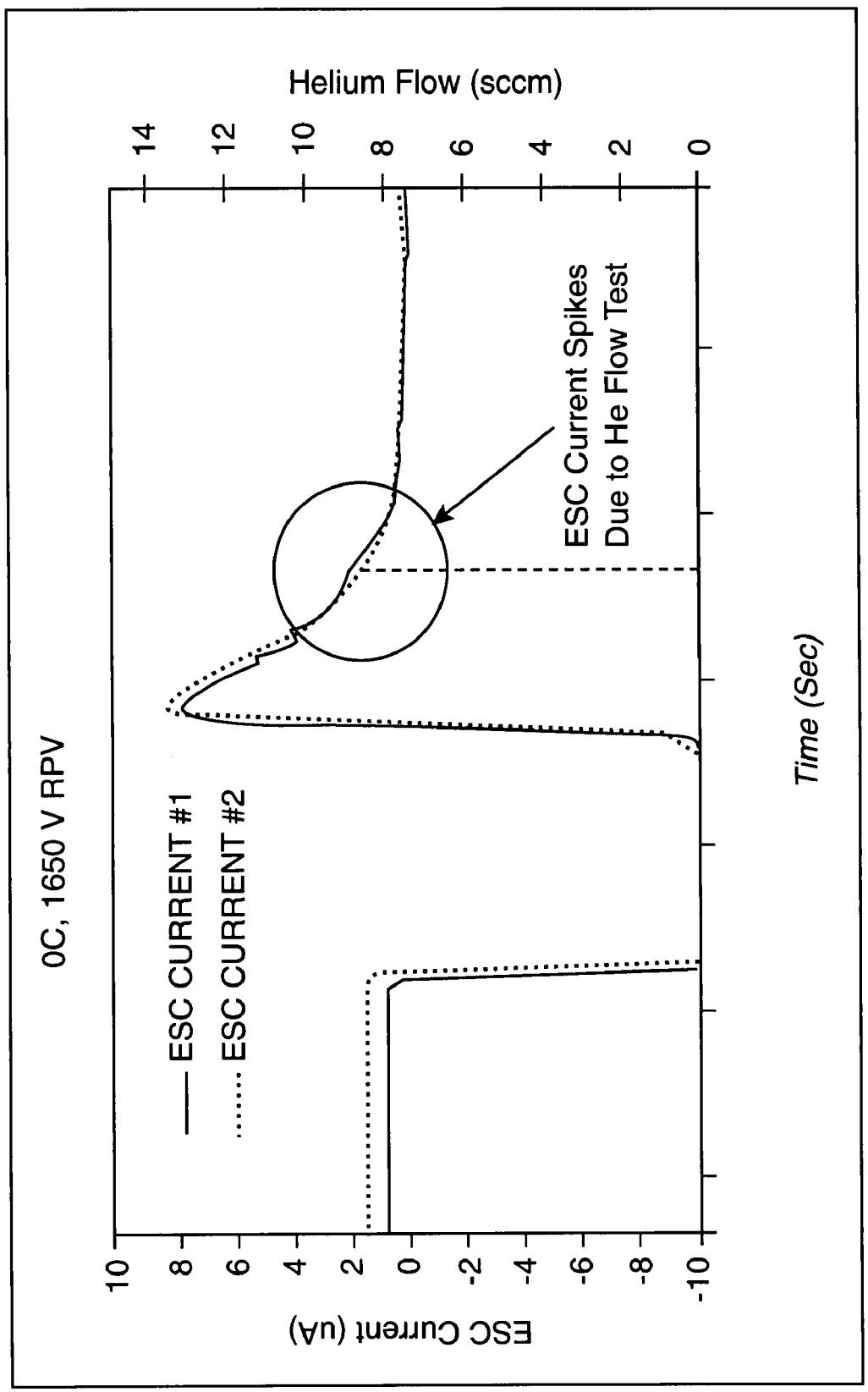
FIG. 7A illustrates a current spike for an optimal value of an RPV in accordance with one embodiment of the present invention.
Figure 7B:
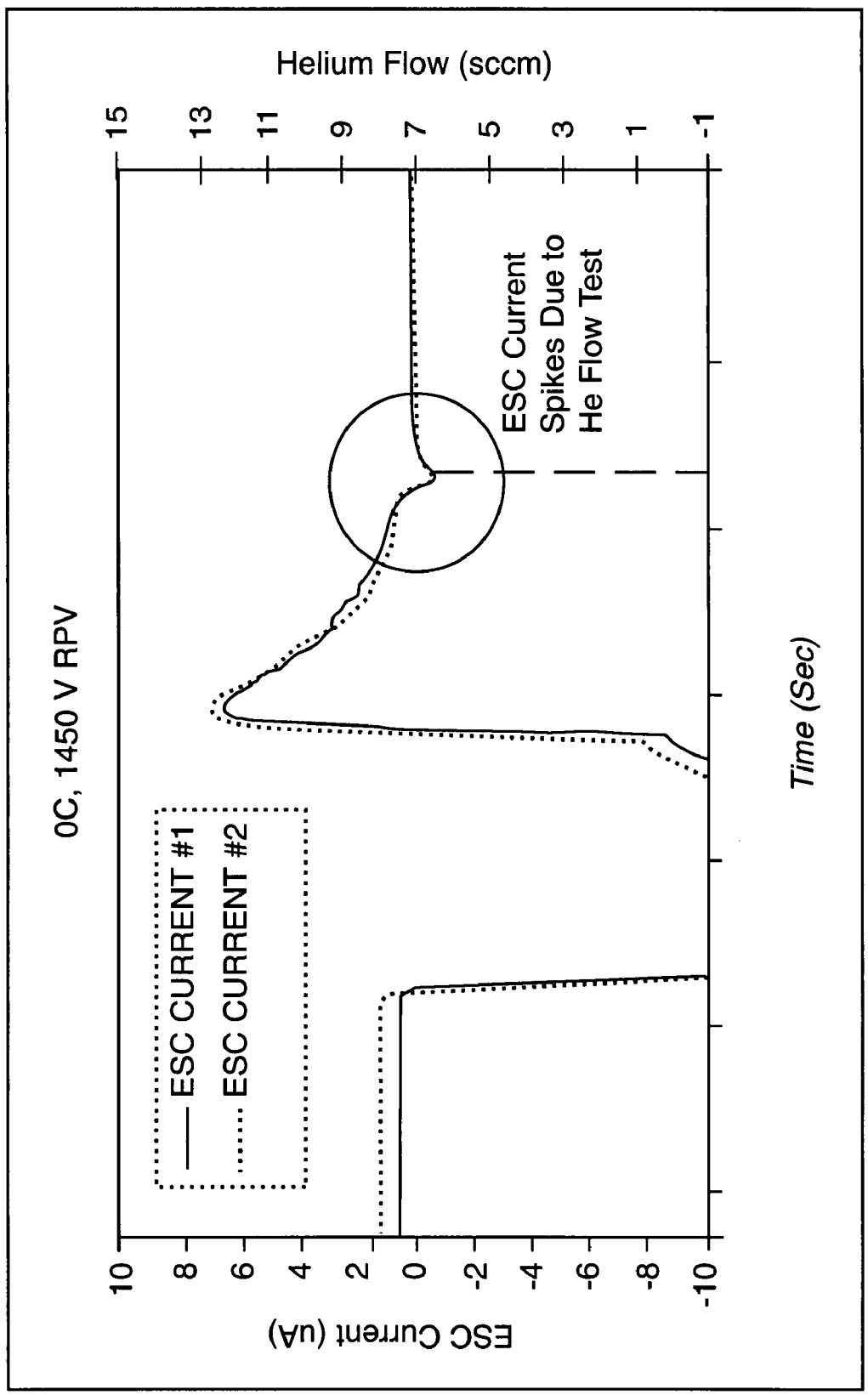
FIG. 7B shows a negative current spike for an RPV that is too low in accordance with one embodiment of the present invention.
Figure 7C:
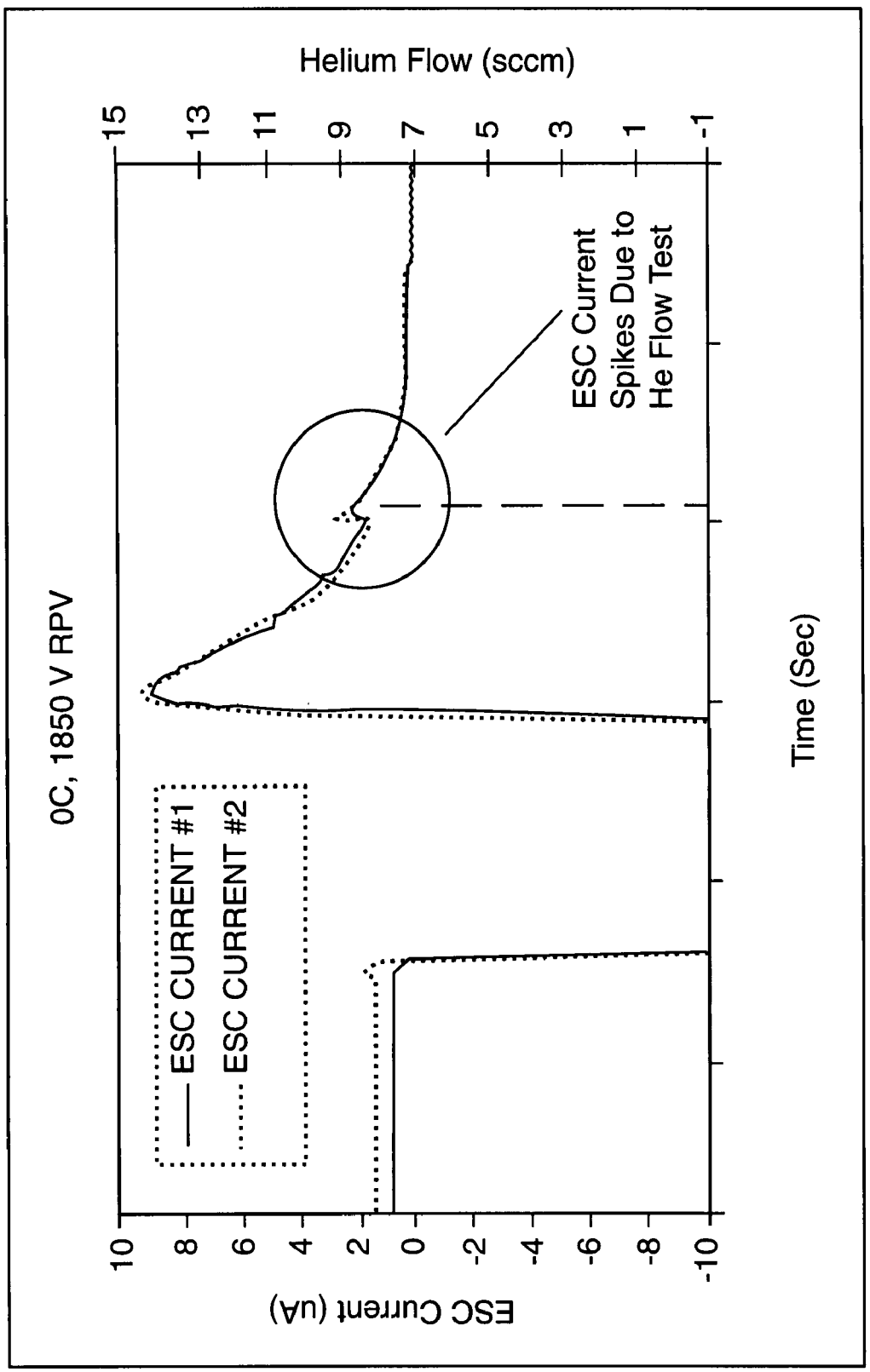
FIG. 7C illustrates a positive current spike for an RPV that is too high in accordance with one embodiment of the present invention.

With reference to FIGS. 7A through 7C, curves are shown which plot ESC current discharges after the ESC power has been turned off. In such examples, ESC current spikes occur when a wafer is raised on lifter pins, which show that the ESC reverse polarity voltage (RPV) was too high or too low or just right. The current spikes in FIGS. 7A through 7C occur when the backside helium pressure (e.g., 4 torr) causes the wafer to move during the helium rise test. In one embodiment, conditions for such a test can be 0 C, 1500 V holding voltage, fixed bias compensation during the processing operation, and 5 second reverse polarity voltage application time. Analysis of the plots of FIGS. 7A through 7C show current discharges in the region 290 as shown in reference to FIG. 5B. Therefore, the analyses of whether the bias compensation voltages were too low or too high as derived from plots such as FIGS. 7A through 7C can be utilized to adjust the bias compensation voltage on subsequent wafers. The plots of FIGS. 7A through 7C (and FIGS. 8A and 8B) correspond to region G as discussed in reference to FIG. 5B. In addition, the plots as described in reference to FIGS. 7A through 9B show one current inverted and one current non-inverted. That is, if both currents are shown as positive on the plot, one of the two is actually negative. The spikes in the plots occur due to mechanical movement of the wafer. The spacing between the wafer and the ESC pole thereby increased causing the capacitance between the wafer pole and the ESC to decrease. In one embodiment of the present invention, the wafer movement may be caused by helium gas pressure slightly lifting the wafer. Current #1 is current discharge from the positive pole and current #2 is current discharge from the negative pole of the bipolar ESC.

FIG. 7A illustrates current spikes for an optimal value of an RPV in accordance with one embodiment of the present invention. In one embodiment, an RPV of 1650 V is utilized to generate the curves as shown in FIG. 7A. In this embodiment, when a backside helium pressure causes the wafer to move during a helium rise time test, current spikes are measured. In such a case, when the wafer is dechucked from the ESC, electrical changes due to one of the plates of the capacitor being moved generates a spike when clamping voltage still exists on the wafer even after the RPV has been applied. FIG. 7A shows the circumstance where the RPV was substantially correct thereby producing a minimal spike in the current discharge curve as shown.

FIG. 7B shows negative current spikes for an RPV that was too low in accordance with one embodiment of the present invention. In one embodiment, an RPV of 1450 V was utilized to generate the curve as shown in FIG. 7B. When the RPV is too low (or to put it another way, the RPV was not high enough to declamp the wafer), the current spikes of the current discharge curves are negative and also occur later than the spikes as shown in reference to FIG. 7A.

FIG. 7C illustrates positive current spikes for an RPV that was too high in accordance with one embodiment of the present invention. In one embodiment, an RPV of 1850 V was utilized to generate the curve as shown in FIG. 7C. When the RPV is too high (or to put it another way, the RPV was higher than enough to declamp the wafer), the current spikes of the current discharge curves are positive and also occur later than the current spikes as shown in reference to FIG. 7A. Therefore, when processing subsequent wafers, when plots such as, for example, as shown in FIGS. 7A through 7C show an incorrect RPV, then the RPV may be adjusted so attain the proper RPV to generate optimal dechucking.

Figure 8A:
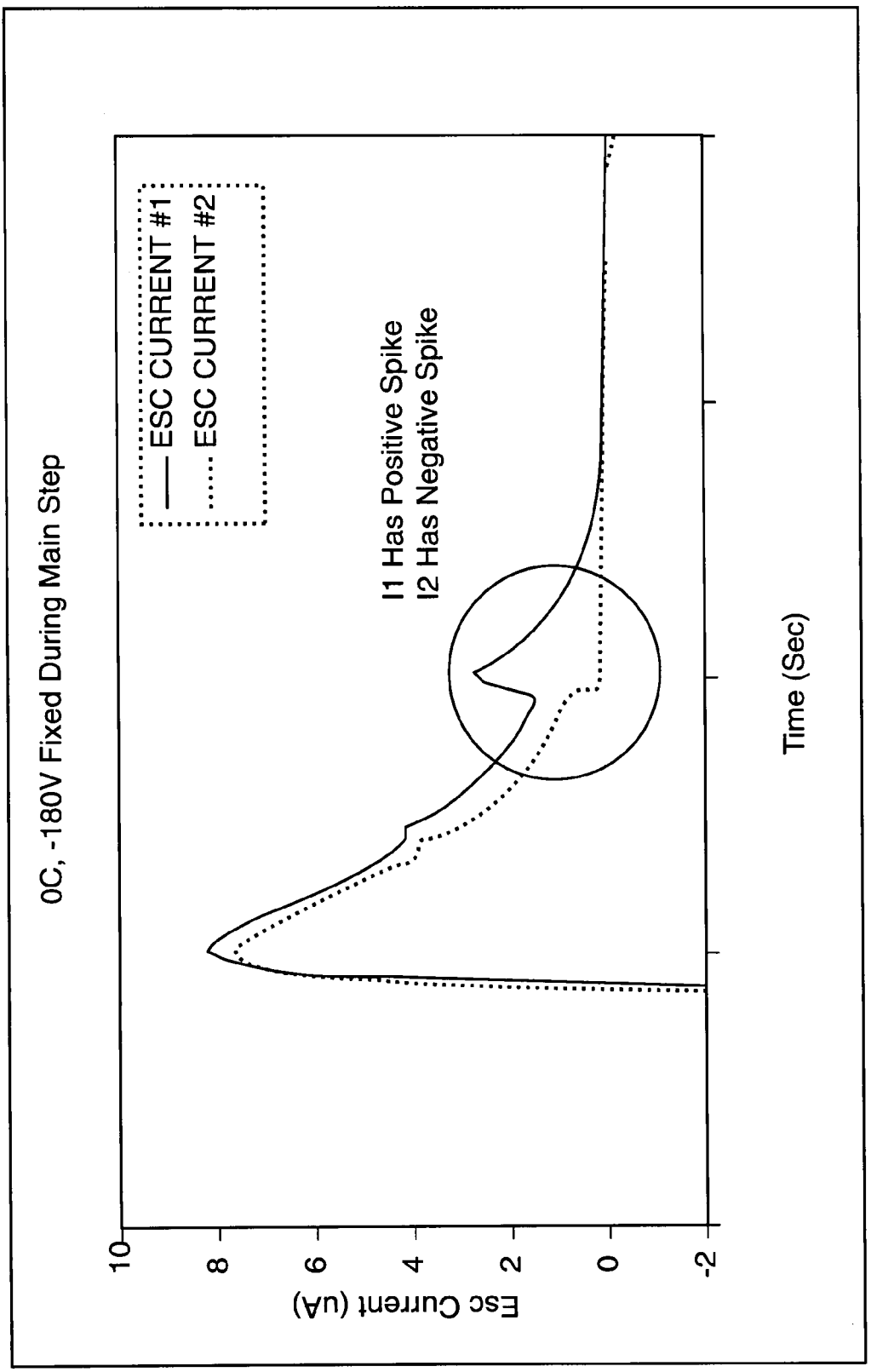
FIG. 8A illustrates the effect on current discharge spikes of a variable fixed bias compensation applied during a main clamping step where the bias compensation voltage is too low in accordance with one embodiment of the present invention.
Figure 8B:
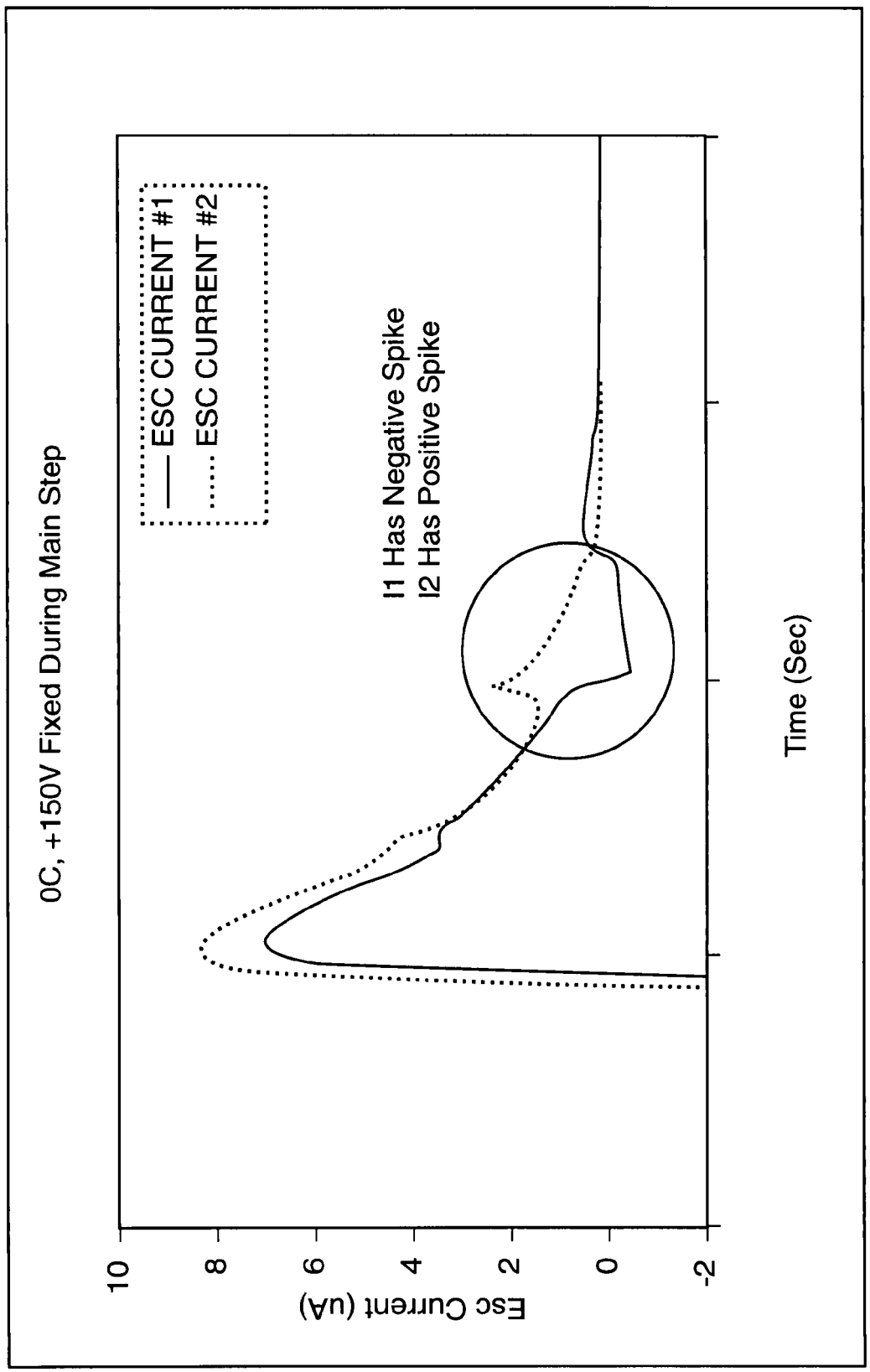
FIG. 8B illustrates the effect on current discharge spikes of a variable fixed bias compensation applied during a main clamping step where the bias compensation voltage was too high in accordance with one embodiment of the present invention.

Analysis of the plots of FIGS. 8A through 8B show current discharges in the region 290 as shown in reference to FIG. 5B during a wafer dechucking sequence. Therefore, the analyses of whether the bias compensation voltages were too low or too high derived from plots such as FIGS. 8A through 8B can be utilized to adjust the bias compensation voltage on subsequent wafers.

FIG. 8A illustrates the effect on current discharge spikes of a variable fixed bias compensation applied during a main clamping step where the bias compensation voltage was too low in accordance with one embodiment of the present invention. If the bias compensation was too low, ESC current I1 will have a positive spike and ESC current I2 will have a negative spike.

FIG. 8B illustrates the effect on current discharge spikes of a variable fixed bias compensation applied during a main clamping step where the bias compensation voltage was too high in accordance with one embodiment of the present invention. If the bias compensation was too high, ESC current I1 will have a negative spike and ESC current I2 will have a positive spike. In one embodiment, a multiplicative factor may be utilized to adjust the bias compensation voltage. Because a particular RF voltage can generate a certain amount of wafer bias voltage in an etching operation, the RF voltage applied to the system may be multiplied by a constant to estimate the wafer bias voltage. Because the bias compensation voltage should be equal to the wafer bias voltage, by varying the constant multiplied with the RF voltage, the bias compensation voltage may be adjusted accordingly. Therefore, the constant may be decreased or increased depending on whether the bias compensation voltage was found to be too low or too high.

If the bias compensation voltage and the RPV were both wrong the resulting current spike signals would be a combination of: 1) the case as discussed in reference to FIGS. 8A through 8B, and 2) the case as discussed in FIGS. 7A through 7C. If the spikes of the current discharges of the region 290 are in the same direction with the same magnitude (as in FIGS. 7B and 7C) then the RPV was incorrect. If the spikes are in different directions (as shown in FIGS. 8A and 8B) with the same magnitude, then the bias compensation voltage was off. If the spikes have different magnitudes, in the same or in the opposite direction, then both the RPV and bias compensation voltage were incorrect.

FIGS. 9A and 9B discussed below can be utilized to determine an incorrect bias compensation before dechucking thereby enabling the correcting of the bias compensation before dechucking of that wafer takes place. These current discharge plots occur after power off of the ESC and before the RPV is applied.

FIG. 9A illustrates a close-up view of current discharge profiles of currents from a negative pole and a positive pole from a bipolar ESC where the bias compensation was too low in accordance with one embodiment of the present invention. According to the plot of FIG. 9A, after the ESC voltage is turned off, the magnitude of the negative pole decay current 500 is larger than the magnitude of the positive pole decay current 502. This implies that the negative pole ESC holding voltage magnitude was larger than the positive pole holding voltage magnitude, which in turn implies that the ESC bias compensation voltage was too low (too negative).

FIG. 9B illustrates a close-up view of current discharge profiles of currents from a negative pole and a positive pole from a bipolar ESC where the bias compensation was too low in accordance with one embodiment of the present invention. According to the plot of FIG. 9B, after the ESC voltage is turned off, the magnitude of the positive pole decay current 502 is greater than the magnitude of the negative pole decay current 500. This implies that the positive pole ESC holding voltage magnitude was greater than the negative pole holding voltage magnitude, which in turn implies that the ESC bias compensation voltage was too high (too positive).

It should be appreciated that because the current discharge readings from FIGS. 9A and 9B take place after ESC power off but before the application of the RPV, an offset may be applied to the positive and negative poles depending on the readings from measurements such as, for example, FIGS. 9A and 9B. As result, because bias compensation errors can be detected before the RPV application, the same wafer from which the readings are taking place can have an application of the RPV with the offset voltage to enhance dechucking operations. In one embodiment, the value of the offset voltage would be determined from the current difference between the current 502 and the current 500. A positive value of the difference between the positive pole discharge and the negative discharge current indicates that the bias compensation voltage was too low (e.g., too negative). A negative value of the difference between the positive pole discharge current and the negative pole discharge current would indicate that the bias compensation voltage was too high (too positive). The value of the offset voltage may be determined from the measured current difference during the voltage off step as measured in the plots of FIGS. 9A and 9B. Consequently, a user does not have to wait until a subsequent wafer to correct for a bias compensation that is too low or too high.

Figure 10:
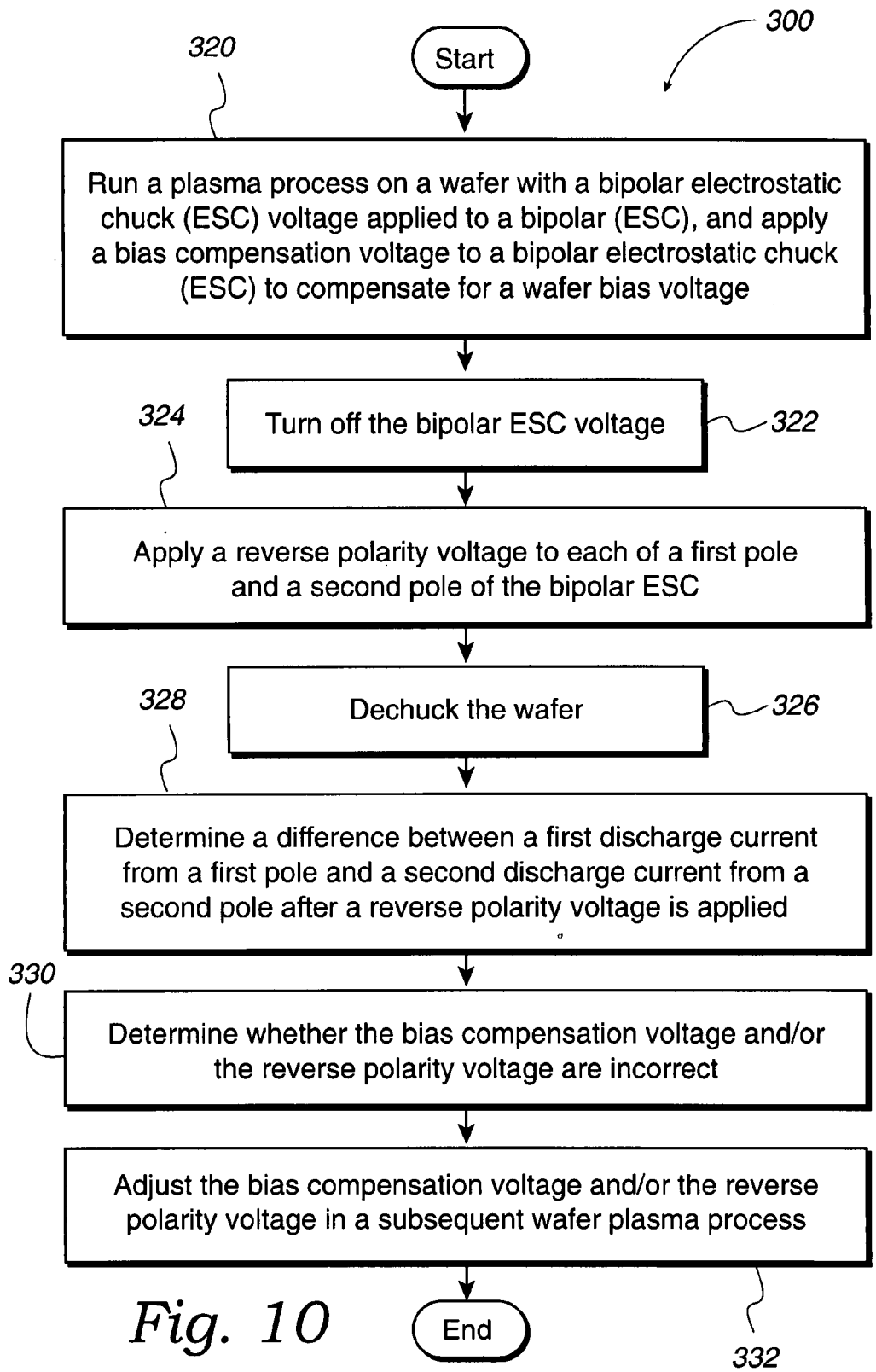
FIG. 10 illustrates a flowchart which defines a method for correcting an incorrect reverse polarity voltage and/or an incorrect bias compensation voltage in a subsequent wafer processing operation in accordance with one embodiment of the present invention.
Figure 11:
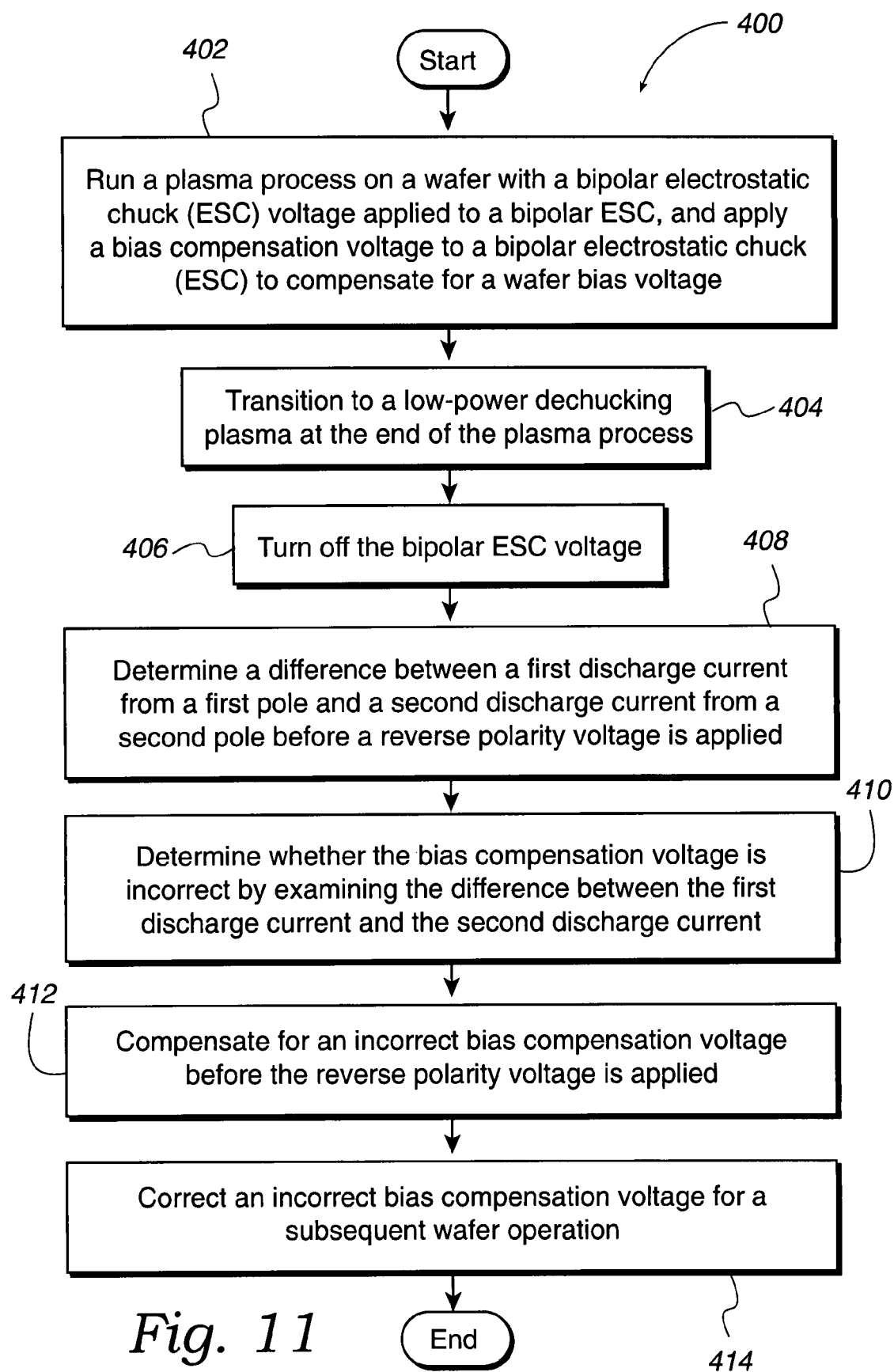
FIG. 11 shows a flowchart which defines a method for compensating for an incorrect bias compensation voltage in a current wafer processing operation in accordance with one embodiment of the present invention.

FIGS. 10 and 11 below describe exemplary methodology to either fix or compensate for monopolar component errors. Monopolar component errors include any type of error that results in non-zero net charge on the wafer. It should be appreciated that monopolar component errors may include bias compensation errors, unequal voltage outputs from the bipolar ESC voltage supply, unequal amounts of capacitance to the wafer from the positive and negative poles of the ESC. In one embodiment, bias compensation errors are the most significant monopolar component errors. The methodology described herein is capable of either correcting or compensating for monopolar component errors (e.g., bias compensation errors).

Figure 10A:
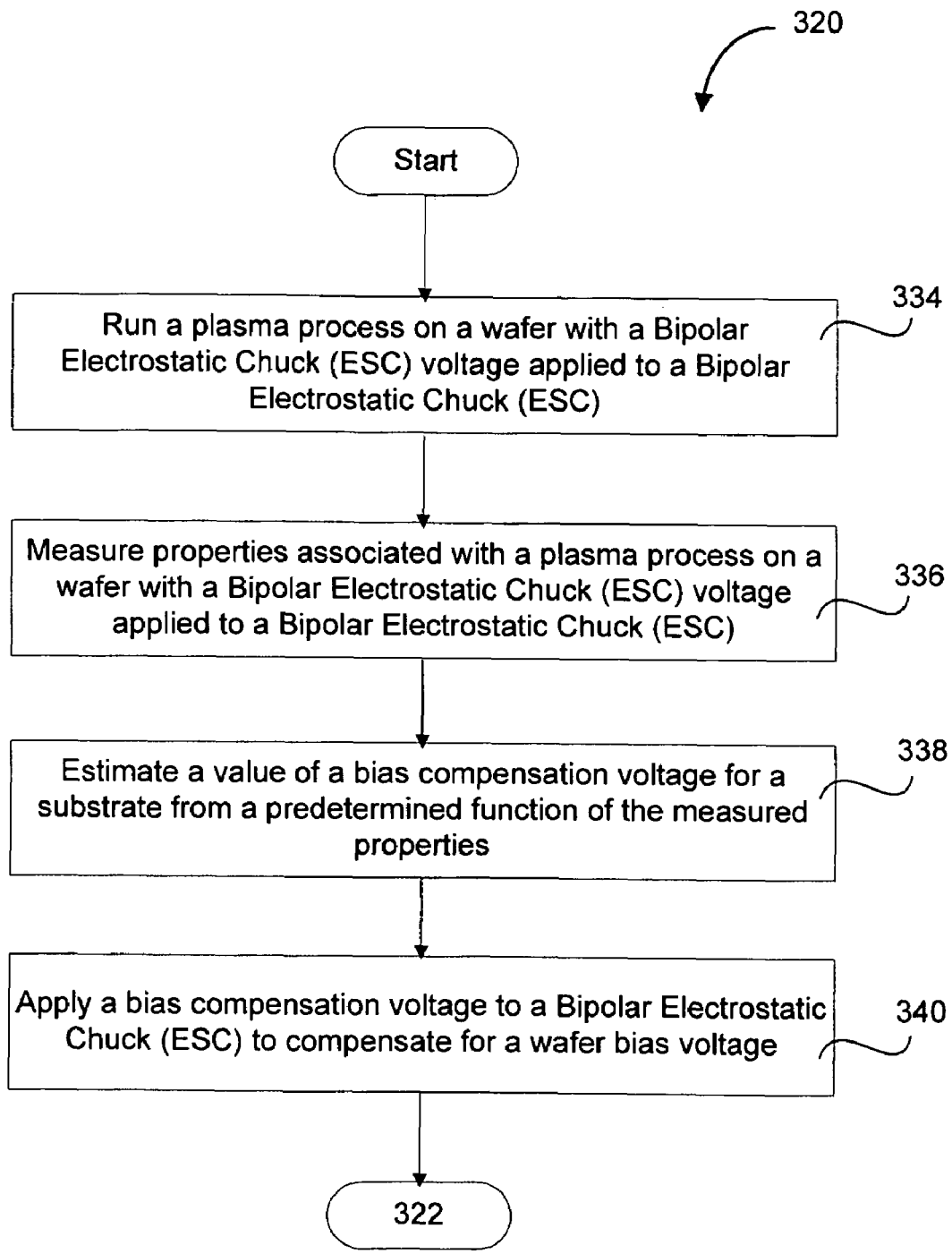
FIG. 10A illustrates a flowchart that defines a method for estimating a value of a bias compensation voltage in a current wafer processing operation in accordance with one embodiment of the present invention.

FIG. 10 illustrates a flowchart 300 which defines a method for correcting an incorrect reverse polarity voltage and/or an incorrect bias compensation voltage in a subsequent wafer processing operation in accordance with one embodiment of the present invention. The method includes operation 320 which runs a plasma process on a wafer with a bipolar electrostatic chuck (ESC) voltage applied to a bipolar ESC, and applies a bias compensation voltage to a bipolar electrostatic chuck (ESC) to compensate for a wafer bias voltage. As will be recognized by those of ordinary skill, the bias compensation voltage applied to the bipolar electrostatic chuck (ESC) to compensate for the wafer bias voltage can be estimated using various techniques. For example, the value of the bias compensation voltage applied to the bipolar electrostatic chuck (ESC) can be estimated as a function of measured properties associated with the plasma process run on the wafer. More particularly, as shown in FIG. 10A, the plasma process is run on the wafer at operation 334. At operation 336, properties associated with running the plasma process on the wafer are measured. At operation 338, the measured properties are used to calculate a value of the bias compensation voltage. Then at operation 340, the bias compensation voltage calculated at operation 338 can be applied to the bipolar electrostatic chuck (ESC) to compensate for the wafer bias voltage.

In one embodiment of the present invention, as discussed above in FIG. 8B, a property that can be measured to estimate a bias compensation voltage is the amplitude of an RF voltage applied to an ESC electrode of the bipolar electrostatic chuck (ESC). Once the amplitude of the RF voltage is measured, a bias compensation voltage can be applied to the ESC electrode, where a value of the applied bias compensation voltage is some multiple of the RF voltage amplitude. For example, a negative DC wafer bias compensation voltage with a magnitude equal to 1.0 times the measured RF voltage amplitude can be selected.

In one embodiment of the present invention, another property that can be measured to estimate a value of a bias compensation voltage is the bias voltage on a small electrode exposed to the plasma supplied to an interior of a plasma processing chamber. In this embodiment, the small exposed electrode can be connected to the same RF voltage as the ESC electrode and the bias voltage on the small electrode can be measured. Because the bias voltage measured on the small electrode is assumed to be the same as the bias voltage on the wafer, the estimated value of bias compensation voltage is set to the bias voltage measured on the small electrode.

In another embodiment of the present invention, a semi-empirical model of a plasma processing chamber can be used to predict a value of a wafer bias voltage. This wafer bias voltage value can then be used as an estimation of the bias compensation voltage applied to the bipolar electrostatic chuck (ESC). More particularly, the semi-empirical model can be executed as a computer program that predicts a wafer bias compensation using as its input certain known plasma processing conditions. These plasma processing conditions can include, but are not limited to, a composition of a gas mixture present in the plasma of the plasma processing chamber; a pressure of the gas present in the plasma of the processing chamber; a flow rate of the gas to the processing chamber; and a magnitude of the RF power applied to the plasma of the processing chamber.

According to an embodiment of the present invention, measured properties including one or any combination of the properties discussed above can be used to estimate a value of a bias compensation voltage. Once the bias compensation value is estimated in operations 336 and 338 or by any other means known to those of ordinary skill, the method continues at operation 340 where the bias compensation voltage is applied to the bipolar electrostatic chuck (ESC) to compensate for the wafer bias voltage.

Referring again to FIG. 10, after operation 320, the method proceeds to operation 322 which turns off the bipolar ESC voltage. Then operation 324 applies a reverse polarity voltage to each of a first pole and a second pole of the bipolar ESC. After operation 324, the method moves to operation 326 where the wafer is dechucked. Then operation 328 determines a difference between a first discharge current from the first pole and a second discharge current from the second pole after a reverse polarity voltage is applied. The current spikes that occur when the wafer moves slightly can be measured after being dechucked. The motion can be due to the ESC lifter pins raising the wafer or, preferably, to a small amount of helium pressure between the wafer and the ESC. The spikes may occur when the wafer was well enough dechucked to be able to move, but still had some residual electrical charge. Examples of these spikes are given in FIGS. 7B, 7C, 8A, and 8B. After operation 328, the method advances to operation 330 which determines whether the bias compensation voltage and/or the reverse polarity voltage are incorrect. In operation 330, the sum of the current spikes are examined to adjust the RPV for a subsequent wafer, and the difference of the current spikes may be examined to adjust the main step bias compensation voltage for a subsequent wafer. In this operation, plots such as, for example, as shown in FIGS. 7B to 8B may be examined to determine the polarity and magnitudes of the current spikes. Then operation 332 adjusts at least one of an ESC bias compensation voltage, an ESC reverse polarity voltage, and an ESC offset voltage in a subsequent wafer plasma process. The information contained in the magnitude and polarity of the spikes in plots such as, for example, those in FIGS. 7B to 8B may be utilized to: 1) adjust the ESC reverse polarity magnitude (pole-to-pole) on a subsequent wafer; 2) adjust the ESC bias compensation voltage during the main process on a subsequent wafer; and/or 3) adjust the ESC offset voltage during the dechucking sequence for a subsequent wafer.

Figure 11A:
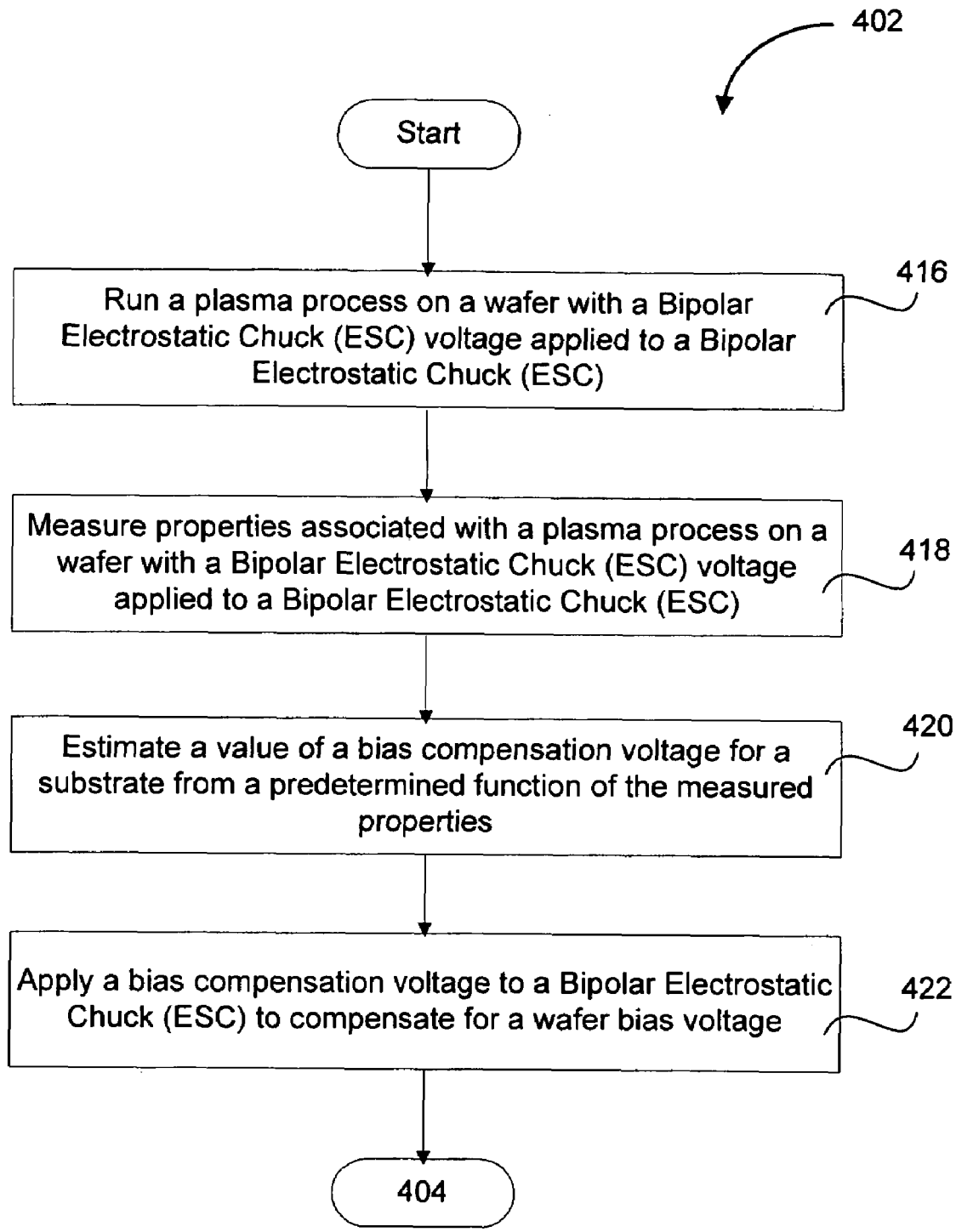
FIG. 11A illustrates a flowchart that defines a method for estimating a value of a bias compensation voltage in a current wafer processing operation in accordance with one embodiment of the present invention.

FIG. 11 shows a flowchart 400 which defines a method for compensating for an incorrect bias compensation voltage in a current wafer processing operation in accordance with one embodiment of the present invention. The method begins with operation 402 which runs a plasma process on a wafer with a bipolar electrostatic chuck (ESC) voltage applied to a bipolar ESC, and apply a bias compensation voltage to a bipolar electrostatic chuck (ESC) to compensate for a wafer bias voltage. As will be recognized by those of ordinary skill, the bias compensation voltage applied to the bipolar electrostatic chuck (ESC) to compensate for the wafer bias voltage can be estimated using various techniques. For example, the value of the bias compensation voltage applied to the bipolar electrostatic chuck (ESC) can be estimated as a function of measured properties associated with the plasma process run on the wafer. More particularly, as shown in FIG. 11A, the plasma process is run on the wafer at operation 416. At operation 418, properties associated with running the plasma process on the wafer are measured. At operation 420, the measured properties are used to calculate a value of the bias compensation voltage. Then at operation 422, the bias compensation voltage calculated at operation 420 can be applied to the bipolar electrostatic chuck (ESC) to compensate for the wafer bias voltage.

In one embodiment of the present invention, as discussed above in FIG. 8B, a property that can be measured to estimate a bias compensation voltage is the amplitude of an RF voltage applied to an ESC electrode of the bipolar electrostatic chuck (ESC). Once the amplitude of the RF voltage is measured, a bias compensation voltage can be applied to the ESC electrode, where a value of the applied bias compensation voltage is some multiple of the RF voltage amplitude. For example, a negative DC wafer bias compensation voltage with a magnitude equal to 1.0 times the measured RF voltage amplitude can be selected.

In one embodiment of the present invention, another property that can be measured to estimate a value of a bias compensation voltage is the bias voltage on a small electrode exposed to the plasma supplied to an interior of a plasma processing chamber. In this embodiment, the small exposed electrode can be connected to the same RF voltage as the ESC electrode and the bias voltage on the small electrode can be measured. Because the bias voltage measured on the small electrode is assumed to be the same as the bias voltage on the wafer, the estimated value of bias compensation voltage is set to the bias voltage measured on the small electrode.

In another embodiment of the present invention, a semi-empirical model of a plasma processing chamber can be used to predict a value of a wafer bias voltage. This wafer bias voltage value can then be used as an estimation of the bias compensation voltage applied to the bipolar electrostatic chuck (ESC). More particularly, the semi-empirical model can be executed as a computer program that predicts a wafer bias compensation using as its input certain known plasma processing conditions. These plasma processing conditions can include, but are not limited to, a composition of a gas mixture present in the plasma of the plasma processing chamber; a pressure of the gas present in the plasma of the processing chamber; a flow rate of the gas to the processing chamber; and a magnitude of the RF power applied to the plasma of the processing chamber.

According to an embodiment of the present invention, measured properties including one or any combination of the properties discussed above can be used to estimate a value of a bias compensation voltage. Once the bias compensation value is estimated in operations 418 and 420 or by any other means known to those of ordinary skill, the method continues at operation 422 where the bias compensation voltage is applied to the bipolar electrostatic chuck (ESC) to compensate for the wafer bias voltage.

Referring again to FIG. 11, after operation 402, the method advances to operation 404 which transitions to a low-power dechucking plasma at the end of the plasma process. Then operation 406 turns off the bipolar ESC voltage. Operation 406 can occur after the plasma has stabilized in its low power state. It should be appreciated that the operation 406 may take any suitable amount of time. In one embodiment, operation 406 lasts about 2 seconds and would have the plasma on. At this point, a first ESC decay current and a second ESC decay current are measured before ESC reverse polarity voltages are applied. These decay currents are illustrated in FIGS. 9A and 9B, and an example for a single pole is also shown as region "B" in FIG. 5B. After operation 406, the method proceeds to operation 408 which determines a difference between a first discharge current from a first pole and a second discharge current from a second pole. A first difference between the method as described in reference to FIG. 10 and the method described in flowchart 400 is that the ESC decay current is measured before a reverse polarity voltage is applied, and a second difference is that unlike the method of examining current "spikes", measuring ESC decay currents do not require the wafer to move. Then operation 410 determines whether the bias compensation voltage is incorrect by examining the difference between the first discharge current and the second discharge current. A larger value of the difference between the first discharge current and the second discharge current indicates that the bias compensation voltage was too low (e.g., too negative). A smaller value of the difference between the first discharge current and the second discharge current would indicate that the bias compensation voltage was too high (too positive). After operation 410, the method advances to optional operation 412 which compensates for an incorrect bias compensation voltage before the reverse polarity voltage is applied. Operation 412 includes examination of the information contained in the relative magnitudes of the two decay currents which may be used to adjust the ESC offset voltage during the dechucking sequence for the same wafer. Therefore, if the bias compensation voltage was found to be too high or too low, an ESC offset voltage may be applied that can correct for the error. After optional operation 412, an optional operation 414 corrects an incorrect bias compensation voltage for a subsequent wafer operation. In one embodiment, the information contained in the relative magnitudes of the two decay currents may be used to adjust the ESC offset voltage for a subsequent wafer. In another embodiment of operation 414, the information contained in the relative magnitudes of the two decay currents may be used to adjust the ESC bias compensation voltage during the main process on a subsequent wafer. In one embodiment, at least one of operation 412 or operation 414 is conducted to optimize wafer dechucking operations. In another embodiment, both operations 412 and 414 may be conducted.

While there have been described and illustrated specific embodiments of the invention, it will be clear that variations in the details of the embodiments specifically illustrated and described may be made without departing from the true spirit and scope of the invention as defined in the appended claims.

While this invention has been described in terms of several preferable embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for dechucking a subsequent substrate from a bipolar electrostatic chuck (ESC), comprising:
    applying a bipolar ESC clamping voltage and a bias compensation voltage to the bipolar electrostatic chuck (ESC) during processing of a current substrate;
    determining an error of a value of the bias compensation voltage for the current substrate, wherein the error of the value of the bias compensation voltage for the current substrate is determined during the dechucking of the current substrate from the bipolar electrostatic chuck (ESC); and
    correcting a value of the bias compensation voltage for the subsequent substrate based on the error of the value of the bias compensation voltage for the current substrate.

2. The method for dechucking the subsequent substrate from the bipolar electrostatic chuck (ESC) as recited in claim 1, further comprising estimating the value of the bias compensation voltage for the current substrate.

3. The method for dechucking the subsequent substrate from the bipolar electrostatic chuck (ESC) as recited in claim 2, wherein estimating the value of the bias compensation voltage for the current substrate includes:
    measuring properties associated with the processing of the current substrate; and
    calculating the estimated the value of the bias compensation voltage for the current substrate as a function of the measured properties.

4. The method for dechucking the subsequent substrate from the bipolar electrostatic chuck (ESC) as recited in claim 3, wherein the measured properties associated with the processing of the current substrate include one or more of:
    an amplitude of a radio frequency (RF) voltage applied to an ESC electrode of the bipolar electrostatic (ESC) chuck;
    a bias voltage on an electrode exposed to plasma supplied to an interior of a processing chamber associated with the bipolar electrostatic chuck (ESC);
    a composition of a gas present in the plasma of the processing chamber;
    a pressure the gas present in the plasma of the processing chamber;
    a flow rate of the gas to the processing chamber; and
    a magnitude of radio frequency (RF) power applied to the plasma of the processing chamber.

5. The method for dechucking the subsequent substrate from the bipolar electrostatic chuck (ESC) as recited in claim 1, wherein determining the error of the value of the bias compensation voltage for the current substrate includes:
    examining a first current spike from a positive pole of the bipolar electrostatic chuck (ESC); and
    examining a second current spike from a negative pole of the bipolar electrostatic chuck (ESC),
    wherein examining the first current spike from the positive pole of the bipolar electrostatic chuck (ESC) and the second current spike from the negative pole of the bipolar electrostatic chuck (ESC) occurs as the current substrate is physically moved from the bipolar electrostatic chuck (ESC).

6. The method for dechucking the subsequent substrate from the bipolar electrostatic chuck (ESC) as recited in claim 5, wherein determining the error of the value of the bias compensation voltage for the current substrate further includes:
    determining that the value of the bias compensation voltage for the current substrate is low, if the first current spike from the positive pole of the electrostatic chuck (ESC) is positive and the second current spike from the negative pole of the electrostatic chuck (ESC) is negative; and
    determining that the value of the bias compensation voltage for the current substrate is high, if the first current spike from the positive pole of the electrostatic chuck (ESC) is negative and the second current spike from the negative pole of the electrostatic chuck (ESC) is positive.

7. The method for dechucking the subsequent substrate from the bipolar electrostatic chuck (ESC) as recited in claim 6, wherein correcting the value of the bias compensation voltage for the subsequent substrate includes:
increasing the value of the bias compensation voltage for the subsequent substrate when the value of the bias compensation voltage for the current substrate is low; and
decreasing the value of the bias compensation voltage for the subsequent substrate when the value of the bias compensation voltage for the current substrate is high.

8. The method for dechucking the subsequent substrate from the bipolar electrostatic chuck (ESC) as recited in claim 1, wherein determining the error of the value of the bias compensation voltage for the current substrate includes:
examining a first electrical discharge current from a positive pole of the bipolar electrostatic chuck (ESC); and
examining a second electrical discharge current from a negative pole of the bipolar electrostatic chuck (ESC),
wherein examining the first electrical discharge current from the positive pole of the bipolar electrostatic chuck (ESC) and the second electrical discharge current from the negative pole of the bipolar electrostatic chuck (ESC) occurs after the bipolar ESC clamping voltage is turned off and before the current substrate is physically moved from the bipolar electrostatic chuck (ESC).

9. The method for dechucking the subsequent substrate from the bipolar electrostatic chuck (ESC) as recited in claim 8, wherein determining the error of the value of the bias compensation voltage for the current substrate further includes:
calculating a difference between the first electrical discharge current and the second electrical discharge current;
determining that the bias compensation voltage is low, if the difference between the first electrical discharge current and the current is a positive value; and
determining that the bias compensation voltage is high, if the difference between the first electrical discharge current and the second electrical discharge current is a negative value.

10. The method for dechucking the subsequent substrate from the bipolar electrostatic chuck (ESC) as recited in claim 9, wherein correcting the value of the bias compensation voltage for the subsequent substrate includes:
increasing the value of the bias compensation voltage for the subsequent substrate when the value of the bias compensation voltage for the current substrate is low; and
decreasing the value of the bias compensation voltage for the subsequent substrate when the value of the bias compensation voltage for the current substrate is high.

11. A method for dechucking a current substrate from a bipolar electrostatic chuck (ESC), comprising:
applying a bipolar ESC clamping voltage and the bias compensation voltage to the bipolar electrostatic chuck (ESC) during processing of the current substrate, wherein a value of the bias compensation voltage of the current substrate is estimated;
determining an error of a value of the bias compensation voltage for the current substrate; and
adding an offset voltage to a reverse polarity voltage for the current substrate based on the error of the value of the bias compensation voltage for the current substrate.

12. The method for dechucking the current substrate from the bipolar electrostatic chuck (ESC) as recited in claim 11, wherein estimating the value of the bias compensation voltage for the current substrate includes:
measuring properties associated with the processing of the current substrate; and
calculating the estimated the value of the bias compensation voltage for the current substrate as a function of the measured properties.

13. The method for dechucking the current substrate from the bipolar electrostatic chuck (ESC) as recited in claim 12, wherein the measured properties associated with the processing of the current substrate include one or more of:
an amplitude of a radio frequency (RF) voltage applied to an ESC electrode of the bipolar electrostatic (ESC) chuck;
a bias voltage on an electrode exposed to plasma supplied to an interior of a processing chamber associated with the bipolar electrostatic chuck (ESC);
a composition of a gas present in the plasma of the processing chamber;
a pressure the gas present in the plasma of the processing chamber;
a flow rate of the gas to the processing chamber; and
a magnitude of radio frequency (RF) power applied to the plasma of the processing chamber.

14. The method for dechucking the current substrate from the bipolar electrostatic chuck (ESC) as recited in claim 11, further comprising:
transitioning to a low-power dechucking plasma at an end of the processing of the current substrate.

15. The method for dechucking the current substrate from the bipolar electrostatic chuck (ESC) as recited in claim 11, wherein determining the error of the value of the bias compensation voltage for the current substrate includes:
examining a first electrical discharge current from a positive pole of the bipolar electrostatic chuck (ESC); and
examining a second electrical discharge current from a negative pole of the bipolar electrostatic chuck (ESC),
wherein examining the first electrical discharge current and the second electrical discharge current occurs after the bipolar ESC clamping voltage is turned off and before a reverse polarity voltage is applied to the bipolar electrostatic chuck (ESC).

16. The method for dechucking the current substrate from the bipolar electrostatic chuck (ESC) as recited in claim 15, wherein determining the error of the value of the bias compensation voltage for the current substrate further includes:
calculating a difference between the first electrical discharge current and the second electrical discharge current;
determining that the bias compensation voltage is low, if the difference between the first electrical discharge current and the second electrical discharge current is a positive value; and
determining that the bias compensation voltage is high, if the difference between the first electrical discharge current and the second electrical discharge current is a negative value.

17. The method for dechucking the current substrate from the bipolar electrostatic chuck (ESC) as recited in claim 16, wherein adding the offset voltage to the reverse polarity voltage for the current substrate includes:
adding a positive offset voltage when the bias compensation voltage is low; and
adding a negative offset voltage when the bias compensation voltage is high.

* * * * *